United States Patent
Yang et al.

(10) Patent No.: US 11,795,392 B2
(45) Date of Patent: Oct. 24, 2023

(54) CADMIUM-FREE QUANTUM DOT, QUANTUM DOT-POLYMER COMPOSITE, AND ELECTRONIC DEVICE INCLUDING THE SAME

(71) Applicant: SAMSUNG ELECTRONICS CO., LTD., Suwon-si (KR)

(72) Inventors: Hyeyeon Yang, Suwon-si (KR); Jooyeon Ahn, Suwon-si (KR); Taekhoon Kim, Hwaseong-si (KR); Shang Hyeun Park, Yongin-si (KR); Nayoun Won, Yongin-si (KR); Mi Hye Lim, Suwon-si (KR); Shin Ae Jun, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/234,845

(22) Filed: Apr. 20, 2021

(65) Prior Publication Data
US 2021/0324268 A1 Oct. 21, 2021

(30) Foreign Application Priority Data
Apr. 20, 2020 (KR) .................. 10-2020-0047205

(51) Int. Cl.
*C09K 11/88* (2006.01)
*C09K 11/08* (2006.01)
(Continued)

(52) U.S. Cl.
CPC .......... *C09K 11/883* (2013.01); *C09K 11/025* (2013.01); *C09K 11/0883* (2013.01);
(Continued)

(58) Field of Classification Search
CPC . C09K 11/025; C09K 11/883; C09K 11/0883; G02B 6/005; H01L 51/502; H01L 27/322; B82Y 20/00
See application file for complete search history.

(56) References Cited

U.S. PATENT DOCUMENTS 10,741,731 B2  8/2020  Jang et al.
2017/0059988 A1  3/2017  Paek et al.
(Continued)

FOREIGN PATENT DOCUMENTS

CN  106590624  *  4/2017
CN  106753331  *  5/2017
(Continued)

OTHER PUBLICATIONS

Christian Ippen et al., "InP/ZnSe/ZnS: A Novel Multishell System for InP Quantum Dots for Improved Luminescence Efficiency and Its application in a Light-Emitting Device," Journal of Information Display, Jun. 22, 2012, pp. 91-95, vol. 13, No. 2.
(Continued)

*Primary Examiner* — C Melissa Koslow
(74) *Attorney, Agent, or Firm* — CANTOR COLBURN LLP

(57) ABSTRACT

A cadmium-free quantum dot, a quantum dot-polymer composite including the cadmium-free quantum dot, a display device including the quantum dot-polymer composite, and an electroluminescent device including the cadmium-free quantum dot are disclosed, wherein the cadmium-free quantum dot includes a core including a first semiconductor nanocrystal including indium and phosphorus; a light emitting layer surrounding the core and including a second semiconductor nanocrystal including indium and phosphorus; a first shell disposed between the core and the light emitting layer and including a semiconductor nanocrystal including zinc, and selenium, sulfur, or a combination (Continued)

thereof; and a second shell disposed on the light emitting layer and including a semiconductor nanocrystal including zinc, and selenium, sulfur, or a combination thereof, and wherein the quantum is a single light emitting quantum dot having an emission peak wavelength in a range of about 500 nanometers (nm) to about 550 nm.

20 Claims, 6 Drawing Sheets

(51) Int. Cl.
*C09K 11/02* (2006.01)
*F21V 8/00* (2006.01)
*H10K 50/115* (2023.01)
*H10K 59/38* (2023.01)
*B82Y 40/00* (2011.01)
*B82Y 20/00* (2011.01)

(52) U.S. Cl.
CPC .......... *G02B 6/005* (2013.01); *H10K 50/115* (2023.02); *H10K 59/38* (2023.02); *B82Y 20/00* (2013.01); *B82Y 40/00* (2013.01)

(56) References Cited

U.S. PATENT DOCUMENTS

2017/0306227 A1 10/2017 Ippen et al.
2019/0103524 A1* 4/2019 Jang ................. G02F 1/133603

FOREIGN PATENT DOCUMENTS

| CN | 107502337 A | | 12/2017 |
|---|---|---|---|
| CN | 108395892 A | | 8/2018 |
| CN | 109524531 | * | 3/2019 |
| JP | 2010106119 A | | 5/2010 |
| JP | 2019515338 A | | 6/2019 |
| KR | 20190032017 A | | 3/2019 |

OTHER PUBLICATIONS

Zhuolei Zhang et al., "Dual Emissive Cu:InP/ZnS/InP/ZnS Nanocrystals: Single-Source "Greener" Emitters with Flexibly Tunable Emission from Visible to Near-Infrared and Their Application in White Light-Emitting Diodes," Chemistry of Materials, Feb. 2, 2015, pp. 1405-1411, vol. 27.

Office Action dated Aug. 1, 2023 of the corresponding Korean Patent Application No. 10-2020-0047205.

* cited by examiner

Pattern Preparation by using a photoresist

Repeating the Patterning Process three times

CADMIUM-FREE QUANTUM DOT, QUANTUM DOT-POLYMER COMPOSITE, AND ELECTRONIC DEVICE INCLUDING THE SAME

CROSS-REFERENCE TO RELATED APPLICATION

This application claims priority to and the benefit of Korean Patent Application No. 10-2020-0047205 filed in the Korean Intellectual Property Office on Apr. 20, 2020, and all the benefits accruing therefrom under 35 U.S.C. § 119, the entire contents of which are incorporated herein by reference.

BACKGROUND

1. Field

A cadmium-free quantum dot, a quantum dot-polymer composite including the same, and an electronic device including the same are disclosed.

2. Description of the Related Art

A quantum dot ("QD") is a nanocrystal of semiconductor material with a diameter of about several nanometers to several tens of nanometers (i.e., a nano-sized semiconductor nanocrystal), which exhibits a quantum confinement effect. Quantum dots may have different bandgap energies by controlling sizes and compositions of the nanocrystals, unlike bulk materials. Quantum dots may exhibit electroluminescence and photoluminescence properties. In a wet chemical synthesis process, organic materials such as dispersing agents are coordinated on, e.g., bound to, the surface of the semiconductor nanocrystals during crystal growth to provide quantum dots having controlled sizes and luminescence characteristics. Luminescence properties of quantum dots may be applied, e.g., used, in various fields. From an environmental perspective, quantum dots capable of realizing, e.g., exhibiting, improved luminescence properties and free of harmful heavy metals such as cadmium or lead are desirable.

SUMMARY

An embodiment provides quantum dots capable of exhibiting improved luminescence properties, for example, high absorption rate for excitation light.

An embodiment provides a composition including the quantum dots.

An embodiment provides a quantum dot-polymer composite including the quantum dot(s).

An embodiment provides a stacked structure and a display device including the quantum dot-polymer composite.

A quantum dot according to an embodiment includes a core including a first semiconductor nanocrystal including indium and phosphorus; a light emitting layer surrounding the core, the light emitting layer including a second semiconductor nanocrystal including indium and phosphorus; a first shell disposed between the core and the light emitting layer, the first shell including a semiconductor nanocrystal including zinc, and selenium, sulfur, or a combination thereof; and a second shell disposed on the light emitting layer, the second shell including a semiconductor nanocrystal including zinc, and selenium, sulfur, or a combination thereof, wherein the quantum dot does not include cadmium and is a single light emitting quantum dot having an emission peak wavelength in a range of about 500 nanometers (nm) to about 550 nm.

The core of the quantum dot may have a particle diameter ranging from about 1.5 nm to about 3 nm.

The light emitting layer of the quantum dot may have a thickness of less than or equal to about 0.5 nm.

The first shell of the quantum dot may have a thickness of about 0.3 nm to about 1.2 nm.

The second shell of the quantum dot may have a thickness of greater than or equal to about 0.3 nm.

The first shell of the quantum dot may be disposed directly on the core and may include a first layer including a third semiconductor nanocrystal, and a second layer disposed on the first layer, the second layer including a fourth semiconductor nanocrystal, wherein the third semiconductor nanocrystal and the fourth semiconductor nanocrystal may have different compositions.

The third semiconductor nanocrystal may include zinc and selenium, and the fourth semiconductor nanocrystal may include zinc and sulfur.

The fourth semiconductor nanocrystal may not include selenium.

The first layer of the first shell may have a thickness of about 0.1 nm to about 1.0 nm, and the second layer may have a thickness of about 0.2 nm to about 1.1 nm.

The second shell of the quantum dot may include a first layer disposed directly on the light emitting layer, the first layer including a fifth semiconductor nanocrystal, and a second layer disposed on the first layer, the second layer including a sixth semiconductor nanocrystal, wherein the fifth semiconductor nanocrystal and the sixth semiconductor nanocrystal may have different compositions.

The fifth semiconductor nanocrystal may include zinc and selenium, and the sixth semiconductor nanocrystal may include zinc and sulfur.

The sixth semiconductor nanocrystal may not include selenium.

The first semiconductor nanocrystal of the quantum dot may further include zinc.

The quantum dot may have a first absorption peak in the ultraviolet-visible (UV-Vis) absorption spectrum between about 390 nm and about 500 nm.

The light absorbance per particle of the quantum dot may be greater than or equal to about 1.0E-17.

The quantum dot may include RCOOH, RCOOCOR, $RNH_2$, $R_2NH$, $R_3N$, RSH, $R_3PO$, $R_3P$, ROH, RCOOR', $RPO(OH)_2$, $R_2POOH$ (wherein R and R' are independently a substituted or unsubstituted C1 to C30 aliphatic hydrocarbon group, a substituted or unsubstituted C6 to C30 substituted or unsubstituted aromatic hydrocarbon group, or a combination thereof), or a combination thereof on a surface thereof.

A quantum dot-polymer composite according to an embodiment includes a polymer matrix; and quantum dots according to an embodiment dispersed in the polymer matrix.

The polymer matrix may include a thiolene resin, a (meth)acrylate polymer, a urethane resin, an epoxy polymer, vinyl polymer, a silicone resin, or a combination thereof.

A display device according to an embodiment includes a light source and a luminescent element, wherein the luminescent element, includes the quantum dot-polymer composite according to an embodiment, and the light source is configured to provide the luminescent element, with incident light.

An electroluminescent device according to an embodiment includes: a first electrode and a second electrode facing each other, and a quantum dot emission layer disposed between the first electrode and the second electrode, the quantum dot emission layer including a plurality of quantum dots according to an embodiment.

The quantum dot according to an embodiment may exhibit improved luminescence properties (e.g., improved blue light absorption rate and luminous efficiency). The quantum dot may be applied to, e.g., used in, various display devices and biological labeling (e.g., bio sensor or bio imaging, etc.), a photo detector, a solar cell, a hybrid composite, and the like. The improved blue light absorption rate of the quantum dots according to an embodiment may have potential utility in quantum dot based photoluminescent type color filters. Such photoluminescent type color filters may be used in various display devices including, such as, for example, blue light sources, for example, blue light organic light emitting diodes (OLEDs), blue light emitting micro light emitting diodes (LEDs), liquid crystal displays including blue light sources, and the like, such as, for example, televisions (TVs), monitors, mobile devices, virtual reality/augmented reality (VR/AR) devices, vehicle displays, and the like.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
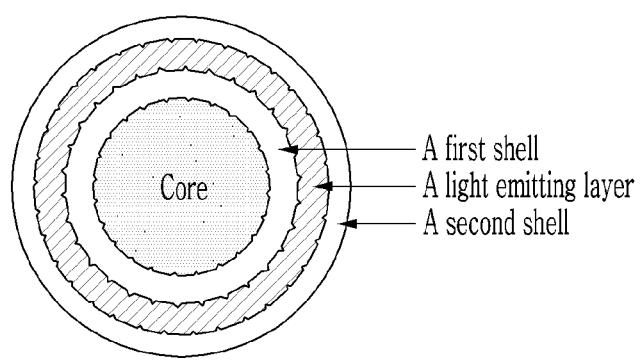
FIG. 1 is a schematic cross-sectional view of a quantum dot according to an embodiment.

Advantages and characteristics of this disclosure, and a method for achieving the same, will become evident referring to the following embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined.

In addition, unless explicitly described to the contrary, the word "comprise," and variations such as "comprises" or "comprising," will be understood to imply the inclusion of stated elements but not the exclusion of any other elements.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Further, the singular includes the plural unless mentioned otherwise. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

It will be understood that, although the terms "first," "second," "third," etc. may be used herein to describe various elements, components, regions, layers, and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" refers to replacement of hydrogen of a compound or a corresponding moiety by a substituent such as a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, halogen (—F, —Cl, —Br, or —I), a hydroxy group (—OH), a nitro group (—NO$_2$), a cyano group (—CN), an amino or amine group (—NRR' wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

Herein, a hydrocarbon group refers to a group including carbon and hydrogen (e.g., an alkyl, alkenyl, alkynyl, or aryl group). The hydrocarbon group may be a group having a monovalence or greater formed by removal of one or more hydrogen atoms from, alkane, alkene, alkyne, or arene. In the hydrocarbon group, a, e.g., at least one, methylene may be replaced by an oxide moiety, a carbonyl moiety, an ester moiety, —NH—, or a combination thereof.

Herein, "alkyl" refers to a linear or branched saturated monovalent hydrocarbon group (methyl, ethyl hexyl, etc.).

Herein, "alkenyl" refers to a linear or branched monovalent hydrocarbon group having one or more carbon-carbon double bonds.

Herein, "alkynyl" refers to a linear or branched monovalent hydrocarbon group having one or more carbon-carbon triple bonds.

Herein, "aryl" refers to a group formed by removal of a, e.g., at least one, hydrogen from an aromatic group (e.g., a phenyl or a naphthyl group).

Herein, "hetero" refers to inclusion of 1 to 3 heteroatoms such as N, O, S, Si, P, or a combination thereof.

Here, "light absorption rate" is a ratio or percentage of an amount of light absorbed in the quantum dot composite with respect to an amount of incident light (excitation light, for example blue light). A total light amount of excitation light (B) is obtained by integrating a PL spectrum of excitation light, and a light amount (B') of the excitation light passing through a quantum dot composite film is obtained, and the light absorption rate is obtained by the following equation:

$(B-B')/B \times 100$=light absorption rate (%)

Herein, "optical density" refers to a value related to absorption rate (absorbance) and may be measured from UV-Vis spectroscopy.

As used herein, "Group" refers to a group of Periodic Table.

As used herein, "Group II" refers to Group IIA and Group IIB, and examples of Group metal may be Cd, Zn, Hg, and Mg, but are not limited thereto.

As used herein, "Group III" refers to Group IIIA and Group IIIB, and examples of Group III metal may be In, Ga, and Tl, but are not limited thereto.

As used herein, "Group V" refers to Group VA, and examples may include nitrogen, phosphorus, arsenic, antimony, and bismuth, but are not limited thereto.

As used herein, "Group VI" refers to Group VIA, and examples may include sulfur, selenium, and tellurium, but are not limited thereto.

As used herein, "first absorption peak" refers to a first main peak at the lowest energy region of the UV-Vis absorption spectrum.

As used herein, values for a certain dimension (e.g., diameter, radius, thickness, size, etc.) may be values for a single entity or a plurality of average values, which may be obtained from appropriate analytical means (e.g., TEM analysis or spectroscopy, etc.).

Quantum dots are nano-sized crystalline semiconductor materials (nanoparticles). Quantum dots may have a large surface area per unit volume, may exhibit a quantum confinement effect, and may exhibit different properties and properties of bulk materials of the same composition. Quantum dots may absorb light from an excitation source and may be an energy exited state, and may emit energy corresponding to their bandgap energies. Quantum dots have a potential to be applied as light emitting materials in various devices (e.g., electronic devices).

Quantum dots having optical properties applicable to devices may be cadmium based quantum dots. Cadmium may raise serious environmental/health issues and is a regulated element under the Restriction of Hazardous Substances Directive (RoHS) in many countries. Examples of cadmium-free quantum dots may be a Group III-V based nanocrystal. However, cadmium-free quantum dots may have poor stability (e.g., chemical stability and thermal stability) compared with cadmium based quantum dots. Thus, when cadmium-free quantum dots are subjected to various processes for application to, e.g., use in, electronic devices, cadmium-free quantum dots may exhibit significantly degraded luminescence properties. On the other hand, quantum dots often use blue light (e.g., wavelength of 450 nm) as excitation light, and cadmium-based or lead-based quantum dots have high absorption intensity for blue light.

In cadmium-free quantum dots, luminescence properties and stability thereof may be improved by introducing a core-shell structure thereinto. For example, a quantum dot pattern may be manufactured by passivating a cadmium-free (e.g., InP) core with a ZnSe/ZnS shell having an increased thickness. However, the shell having an increased thickness may help improve the stability and the luminescence properties in, e.g., to, a desirable level, but the shell thickness increase may greatly increase a weight per one quantum dot and thus cause the number of quantum dots per a given weight and accordingly, decrease an excitation light absorption rate of a composite. For application to, e.g., use in, a device, the quantum dots may be dispersed in a host matrix (e.g., including a polymer, an inorganic material, or a combination thereof) and thus may form a composite. The quantum dot-polymer composite or a color filter including the same may be expected to realize, e.g., provide, a display having high luminance, a wide viewing angle, and high color reproducibility. However, a weight of the quantum dots included in the composite for the application may be limited due to several reasons on a process. Accordingly, a density decrease of the number of the quantum dots per given weight may not be desirable, for example, in terms of an excitation light absorption rate.

When applied to a patterned film strip such as a color filter and the like, the excitation light absorption rate decrease may directly cause a blue leakage in a display device, have a negative influence on color reproducibility (e.g., a DCI concordance rate), and decrease luminous efficiency. As a countermeasure to the decreased excitation light absorption rate, a dye-based, for example, a yellow dye-based blue light absorption layer may be disposed between the quantum dot-based color filter and the substrate. However, this blue light absorption layer disposition may decrease blue light utilization efficiency. In addition, despite the blue light absorption layer disposition, light of less than 500 nm may be emitted in a green light pixel, and accordingly, desired color purity may not be easy to accomplish. Accordingly, development of quantum dots having desired luminous efficiency and an improved excitation light absorption rate is desired.

The present inventors have surprisingly found that absorption of blue light having a wavelength of about 450 nm in a green light emitting quantum dot having an InP core and a ZnSe shell may have be influenced spatially by both the core and the first shell. For example, the present inventors have surprisingly found that a degree of absorption of blue light having a wavelength of about 450 nm may have an influence from, e.g., may be influenced by, a volume of the core and the first shell having a predetermined thickness. However, the core size has a direct influence on an emission peak wavelength and thus may be fixed as a predetermined value for emission of green light. For example, the present inventors have surprisingly found that a ZnSe-based first shell may contribute to absorption of light having a wavelength of about 450 nm, but as the shell thickness increases, contribution to the absorption may exponentially decrease, and then, actually disappear, e.g., no longer contribute to the absorption, at a predetermined thickness, for example, about 3 monolayers (3 ML) or more, and decrease an absorption rate, e.g., of light having a wavelength of about 450 nm. On the contrary, when the thickness of the ZnSe shell is small, an InP core-based quantum dots may exhibit deteriorated, e.g., decreased, luminous efficiency, and accordingly, final photo-conversion efficiency of the quantum dot-polymer composite may be reduced, e.g., decreased, despite the increased absorption rate.

In summary, the quantum dot including an InP-based core and a ZnSe-based first shell may barely or not accomplish desired luminous efficiency and desired absorption rate, simultaneously. Improvement of a low absorption rate of light having a wavelength of about 450 nm of indium phosphide-based quantum dots, compared with quantum dots having a different composition, for example, including cadmium compounds or lead compounds, is desired.

The cadmium-free quantum dot according to an embodiment has a structure/composition as disclosed hereinbelow, and may exhibit improved optical properties, for example, an increased optical density at a wavelength of about 450 nm per particle of the quantum dot, and a composite including the same may emit light of a desired wavelength, for example, green light and also exhibit an improved blue light absorption rate.

The quantum dot according to an embodiment does not include cadmium. The quantum dot includes a core including a first semiconductor nanocrystal including indium (In) and phosphorus (P); a light emitting layer surrounding the core and including a second semiconductor nanocrystal including indium and phosphorus; a first shell disposed between the core and the light emitting layer and including a semiconductor nanocrystal including zinc, and selenium, sulfur, or a combination thereof; and a second shell disposed on the light emitting layer and including a semiconductor nanocrystal including zinc, and selenium, sulfur, or a combination thereof, wherein the quantum dot has an emission peak wavelength in a range of 500 nm to 550 nm and emit light singularly.

FIG. 1 schematically shows a cross-section of the quantum dot according to the embodiment. Referring to FIG. 1, quantum dots according to an embodiment have a core where, e.g., that, is a light emitting region in a center of the particle and a light emitting layer where, e.g., that, is another light emitting region having a larger diameter than the core and having a shape surrounding the core, and include a first shell, which is non-light emitting region, including semiconductor nanocrystal having a different composition from the core and the light emitting layer between the core and the light emitting layer, and a second shell, which is another non-light emitting region, disposed on the light emitting layer. In other words, the quantum dot according to an embodiment is a quantum dot in which the light emitting core is doubly formed, e.g., two light emitting cores are formed.

The quantum dot according to an embodiment is doubly formed, e.g., two light emitting cores are formed, by overlapping two InP-based cores having different diameters from each other as shown in FIG. 1 instead of changing the size of an InP core, which can change the emission peak wavelength, and a volume of the InP core(s) contributing to absorb excitation light may be increased and the absorption rate for excitation light may be greatly improved. In addition, even though the quantum dot has two light emitting cores, the quantum dot emits mono light, e.g., a single light, having a single emission peak wavelength. Accordingly, the quantum dot shows, e.g., exhibits, a higher absorption rate for excitation light while having a similar emission peak wavelength, compared to a quantum dot having a similar size and single InP-based core, and that the quantum dot may show, e.g., exhibit, a higher absorption rate for excitation light and thus show, e.g., exhibit, more excellent, e.g., improved, luminescence characteristics when the quantum dot is employed for, e.g., in, a color conversion layer such as a quantum dot color filter including the same.

As a quantum dot including dual light emitting cores, a quantum dot including a multi-light emitting core has been reported (KR2019-0032017A), may include a first light emitting core including semiconductor nanocrystal including indium and phosphorus, a second light emitting core including semiconductor nanocrystal including indium and phosphorus surrounding the outside of the first light emitting core; and includes a first shell of semiconductor nanocrystal including zinc and selenium (ZnSe) as a non-light emitting region between the first light emitting core and the second light emitting core and a second shell including a semiconductor nanocrystal including zinc and selenium and zinc and sulfur and surrounding the outside of the second light emitting core. Unlike the quantum dot according to an embodiment, in a quantum dot including a multi-light emitting core, the first light emitting core and the second light emitting core each show, e.g., exhibit, different emission peak wavelengths in a distinct wavelength, and the quantum dot including a multi-light emitting core is a multi-light emitting quantum dot emitting both lights in two wavelength ranges from one quantum dot.

A quantum dot according to an embodiment is a quantum dot having a single emission peak wavelength within a range from about 500 nm to about 550 nm, for example, about 505 nm to about 550 nm, about 505 nm to about 545 nm, about 505 nm to about 540 nm, about 510 nm to about 545 nm, about 510 nm to about 540 nm, about 510 nm to about 535 nm, about 515 nm to about 545 nm, about 515 nm to about 540 nm, about 515 nm to about 535 nm, about 520 nm to about 545 nm, about 520 nm to about 540 nm, about 520 nm to about 535 nm, or about 520 nm to about 530 nm, which is a quantum dot emitting a single green light.

As disclosed in KR2019-0032017A patent, quantum dots including the multi-light emitting cores that emit multiple wavelength of light have been reported. However, quantum dots having one emission peak wavelength and having a composition including the first light emitting core, the second light emitting core, the first shell, and the second shell according to an embodiment have not been reported. In other words, it is not easy to produce quantum dots emitting a single light while including multi-light emitting cores.

The core and the light emitting layer including the afore-mentioned compositions each absorb excitation light and each emit green light in the emission peak wavelength region, wherein all the emitted light is also within the afore-mentioned emission peak wavelength region, and the quantum dot according to an embodiment may emit green light having a single emission peak wavelength in the emission peak wavelength region. The quantum dot according to an embodiment may have a precisely controlled size of the core, a thickness of the light emitting layer, a thickness of the first shell, and the like to provide quantum dots emitting single green light while having an increased absorption rate for excitation light. This is in contrast to quantum dots including multi-light emitting cores, for example as described in KR2019-0032017A.

For example, the core of quantum dot according to an embodiment has a size (e.g., a diameter) ranging from about 1.5 nm to about 3 nm. In an embodiment, the size (diameter) of the core may be from about 1.5 nm to about 2.8 nm, for example, about 1.6 nm to about 2.8 nm, about 1.7 nm to about 2.8 nm, about 1.8 nm to about 2.5 nm, or about 1.8 nm to about 2.3 nm, but is not limited thereto. In the present specification, the size (diameter) of the core may refer to a size of the core in the single quantum dot or an average size of the cores in a plurality of quantum dots.

A thickness of the light emitting layer may be smaller than a size (diameter) of the core. When the thickness of the light emitting layer is larger than the size of the core, the light emitting layer may absorb light emitted from the core. In an embodiment, the light emitting layer may have a thickness of less than or equal to about 0.5 nm, for example, less than or equal to about 0.45 nm, less than or equal to about 0.4 nm, less than or equal to about 0.35 nm, or less than or equal to about 0.3 nm, but is not limited thereto.

In addition, the thickness of the light emitting layer may be smaller, e.g., less, than the thickness of the first shell disposed between the core and the light emitting layer. As described herein, in an InP core-based quantum dot, a factor that may greatly influence excitation light absorption is a volume of the InP core, and the volume of the light emitting layer may be determined by a length from the center of quantum dot to the outermost surface of the light emitting layer, which is an outer radius of the light emitting layer. Accordingly, when the outer radius of the light emitting layer is the same, the volume of the light emitting layer calculated therefrom may be the same, and the inner radius of the light emitting layer, (which is changed depending upon a thickness of the light emitting layer), may not be important. Thus, the light emitting layer may be relatively thin, and the first shell disposed between the core and the light emitting layer may be relatively thick in a quantum dot according to an embodiment. Meanwhile, when the thickness of the light emitting layer is thicker than the above range as the outer radius of the light emitting layer increases, the emission peak wavelength of quantum dot may be changed by increasing the total size of the light-emitting core. Thus, the thickness of the light emitting layer may not be increased outside the ranges disclosed herein.

In quantum dots according to an embodiment, the first shell may have a thickness of about 0.3 nm to about 1.2 nm. That is, the first shell may be greater than or equal to a thickness of 1 monolayer (about 0.33 nm) and less than or equal to a thickness of about 4 monolayers (about 1.3 nm) of the semiconductor nanocrystal for forming the first shell. As described herein, in InP core-based quantum dots, when the shell including the Group II-VI semiconductor nanocrystal for forming the shell, for example, ZnS, ZnSe, ZnSeS, or a combination thereof has a thickness of greater than about 3 monolayers (ML), the absorption rate of excitation light may be decreased. In addition, when the thickness of the first shell is less than about 0.3 millimeters (mm) which is less than about 1 monolayer, the first shell may not be uniformly disposed between the core and the light emitting layer. A gap between the core and the light emitting layer may not be maintained, and an increase of an absorption rate of excitation light may not be accomplished by separately disposing each of the core and the light emitting layer.

Thus the thickness of the first shell disposed between the core and the light emitting layer may be appropriately adjusted within the range. In an embodiment, a total thickness of the first shell may be about 0.5 nm to about 1.1 nm, for example, about 0.7 nm to about 1.1 nm, or about 0.8 nm to about 1.0 nm, but is not limited thereto.

The second shell may function to protect the light emitting layer and generally stabilize quantum dots, and the thickness thereof may be greater than or equal to about 0.3 nm which is greater than or equal to about 1 monolayer of semiconductor nanocrystal and may be appropriately adjusted to a thickness desired for stabilizing quantum dots and improving luminous efficiency. In an embodiment, a thickness of the second shell may be greater than or equal to about 0.5 nm, for example, greater than or equal to about 0.6 nm, greater than or equal to about 0.7 nm, greater than or equal to about 0.8 nm, greater than or equal to about 0.9 nm, or greater than or equal to about 1.0 nm, and less than or equal to about 3 nm, less than or equal to about 2.5 nm, less than or equal to about 2.3 nm, less than or equal to about 2 nm, less than or equal to about 1.5 nm, or less than or equal to about 1.3 nm, but is not limited thereto.

In a quantum dot according to an embodiment, the first shell may be disposed directly on the core and may include a first layer including a third semiconductor nanocrystal, and a second layer disposed on the first layer and including a fourth semiconductor nanocrystal wherein the third semiconductor nanocrystal and the fourth semiconductor nanocrystal may have different compositions. For example, the third semiconductor nanocrystal may include zinc and selenium, the fourth semiconductor nanocrystal may include zinc and sulfur, and the fourth semiconductor nanocrystal may not include selenium. In an embodiment, the third semiconductor nanocrystal may include ZnSe, and the fourth semiconductor nanocrystal may include ZnS.

Herein, a thickness of the first layer may be about 0.1 nm to about 1.0 nm, and a thickness of the second layer may be about 0.2 nm to about 1.1 nm. For example, the thickness of the first layer may be about 0.2 nm to about 0.8 nm, for example, about 0.3 nm to about 0.7 nm, about 0.3 nm to about 0.6 nm, about 0.3 nm to about 0.5 nm, or about 0.4 nm and the thickness of the second layer may be about 0.3 nm to about 1.0 nm, for example, about 0.4 nm to about 0.9 nm, about 0.5 nm to about 0.8 nm, about 0.5 nm to about 0.7 nm, or about 0.6 nm, but are not limited thereto.

In the quantum dot according to an embodiment, the second shell may include a first layer disposed directly on the light emitting layer and including a fifth semiconductor nanocrystal, and a second layer disposed on the first layer and including a sixth semiconductor nanocrystal, wherein the fifth semiconductor nanocrystal and the sixth semiconductor nanocrystal may have different compositions. For example, the fifth semiconductor nanocrystal may include zinc and selenium, the sixth semiconductor nanocrystal may include zinc and sulfur, and the sixth semiconductor nanocrystal may not include selenium. In one embodiment, the fifth semiconductor nanocrystal may include ZnSe, and the sixth semiconductor nanocrystal may include ZnS. Herein, the thickness of the first layer and the second layer may be adjusted to an appropriate thickness, similar to the first layer and the second layer in the first shell.

The first semiconductor nanocrystal of the quantum dot according to an embodiment may further include zinc. For example, the first semiconductor nanocrystal may include InZnP.

A size of the quantum dot according to an embodiment may be greater than or equal to about 3 nm, for example, greater than or equal to about 4 nm, greater than or equal to about 5 nm, greater than or equal to about 5.5 nm, greater than or equal to about 6 nm, greater than or equal to about 6.5 nm, greater than or equal to about 6.8 nm, greater than or equal to about 7 nm, greater than or equal to about 7.5 nm, greater than or equal to about 8 nm, greater than or equal to about 8.5 nm, greater than or equal to about 9 nm, or greater than or equal to about 10 nm, and less than or equal to about 20 nm, for example, less than or equal to about 18 nm, less than or equal to about 15 nm, less than or equal to about 13 nm, less than or equal to about 12 nm, or less than or equal to about 11 nm, but is not limited thereto. The size of the quantum dots may be a particle size. The size of a quantum dot, which is not in a spherical shape, may be a diameter calculated by converting a two-dimensional area identified by transmission electron microscopic analysis into a circle.

The quantum dot is not limited to particular shapes, and may have, for example, a spherical shape, a polyhedron, a pyramid, a multipod, or a cube, a nanotube, a nanowire, a nanofiber, a nanosheet, or a combination thereof, but is not limited thereto.

The quantum dot according to an embodiment may have a first absorption peak in the UV-Vis absorption spectrum of between about 390 nm to about 500 nm, for example, between about 400 nm to about 480 nm, between about 430 nm to about 470 nm, or between about 440 nm to about 460 nm. That is, the quantum dot according to an embodiment may be a quantum dot absorbing blue light as excitation light.

The quantum dot according to an embodiment may have a light absorbance of greater than or equal to about 1.0E-17 per a 450 nm particle which is greatly improved as much as about 20 times of the light absorbance in the quantum dot including a single InP core and a shell including ZnS, ZnSe, ZnSeS, or a combination thereof. Accordingly, the quantum dot according to an embodiment is a quantum dot having an increased blue light absorption rate.

The quantum dot may include an organic ligand on the surface. The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, RHPOOH, $R_2POOH$ (wherein R and R' include independently a C1 to C40, for example, a C3 to C30 or a C6 to C24 substituted or unsubstituted aliphatic hydrocarbon, or a C6 to C40 substituted or unsubstituted aromatic hydrocarbon, or a combination thereof), or a combination thereof. The organic ligand may be included alone or in a mixture of two or more organic ligands.

Specific examples of the organic ligand may be methane thiol, ethane thiol, propane thiol, butane thiol, pentane thiol, hexane thiol, octane thiol, dodecane thiol, hexadecane thiol, octadecane thiol, benzyl thiol; methane amine, ethane amine, propane amine, butane amine, pentane amine, hexane amine, octane amine, dodecane amine, hexadecyl amine, oleyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, palmitic acid(palmitic acid), stearic acid; a phosphine such as methyl phosphine, ethyl phosphine, propyl phosphine, butyl phosphine, pentyl phosphine, tributylphosphine, trioctylphosphine, and the like; a phosphine compound or an oxide compound thereof such as methyl phosphine oxide, ethyl phosphine oxide, propyl phosphine oxide, butyl phosphine oxide, trioctylphosphine oxide, and the like; diphenyl phosphine, tri phenyl phosphine compound, or an oxide compound thereof; or phosphonic acid, but is not limited thereto. The organic ligand may be used alone or as a mixture of two or more organic ligands.

In an embodiment, the organic ligand may be a combination of RCOOH and amine (e.g., $RNH_2$, $R_2NH$, $R_3N$, or a combination thereof). The organic ligand may not include glutathione. The quantum dot may be water insoluble. Cadmium-free quantum dots, when dispersed in water, may exhibit an average particle diameter of greater than or equal to about 300 nm in dynamic light scattering analysis. Cadmium-free quantum dots may be dispersed in an organic solvent to form a quantum dot organic solution having an average particle diameter of less than or equal to about 500 nm, less than or equal to about 400 nm, or less than or equal to about 300 nm in dynamic light scattering analysis. The organic solvent is as described herein.

The quantum dot according to an embodiment may be produced using a variety of methods of preparing quantum dots which are well known for a person having ordinary skills in the art, and the preparing method is not particularly limited. For example, the quantum dot may be prepared by a wet preparing method of reacting precursor compounds of the semiconductor nanocrystal for forming a core and a shell in an organic solvent to provide colloid quantum dots. The method of quantum dots according to an embodiment using the wet preparing method includes: preparing a core including a first semiconductor nanocrystal including indium and phosphorus; reacting a, e.g., at least one, non-metal precursor such as a zinc precursor, a selenium precursor, or a sulfur precursor in an organic solvent at a temperature for forming a shell under a presence of the core and the organic ligand to provide a first shell including semiconductor nanocrystal including zinc and selenium, sulfur, or a combination thereof on the surface of the core; injecting an indium precursor and a phosphorus precursor into a solution including semiconductor nanocrystal in which the first shell is formed on the surface of the core and reacting the same to provide a light emitting layer including semiconductor nanocrystal including indium and phosphorus on the first shell; and reacting a, e.g., at least one, type of non-metal precursor such as a zinc precursor, a selenium precursor, or a sulfur precursor in a solution including semiconductor nanocrystal formed with the light emitting layer at a temperature of forming a shell to provide a second shell including semiconductor nanocrystal including zinc and selenium, sulfur, or a combination thereof on the surface of the light emitting layer.

The forming the first and the second shell may include first reacting each of the zinc precursor and the selenium precursor and then reacting the zinc precursor and the sulfur precursor.

In an embodiment, the core may be obtained by preparing an indium precursor solution including an indium precursor and an organic ligand; preparing a phosphorus precursor; heating the indium precursor solution at a reaction temperature for forming a core and adding the phosphorus precursor thereto, optionally, together with an organic ligand and reacting the same. As described herein, a size of the core may be within a range of about 1.5 nm to about 3 nm, for example, about 1.7 nm to about 2.8 nm, about 1.8 nm to about 2.7 nm, about 1.8 nm to about 2.5 nm, or about 1.9 nm to about 2.3 nm, and the size of the core may be easily controlled by adjusting the reaction time for preparing the core.

While the first shell is formed on the core; the light emitting layer is formed on the first shell; and the second shell is formed on the light emitting layer, the thicknesses of the first shell, the light emitting layer, and the second shell may be controlled by adjusting each amount of a zinc precursor, a selenium precursor, a sulfur precursor, an indium precursor, and a phosphorus precursor forming the first shell, the light emitting layer, and the second shell, respectively, each reaction time, or a combination thereof.

The type of the indium precursor may be appropriately selected. For example, the indium precursor may include indium halide, indium nitrate, indium hydroxide, indium fluoride, indium chloride, indium bromide, indium iodide, indium oxide, indium sulfate, indium carboxylate, indium acetate, indium acetylacetonate, or a combination thereof.

The type of the phosphorus precursor may be appropriately selected. For example, the phosphorus precursor may include tris(trimethylsilyl)phosphine, tris(dimethylamino) phosphine, triethylphosphine, tributylphosphine, trioctylphosphine, triphenylphosphine, tricyclohexylphosphine, or a combination thereof.

The zinc precursor may include a Zn metal powder, ZnO, an alkylated Zn compound (e.g., a C2 to C30 dialkyl zinc such as diethyl zinc), a Zn alkoxide (e.g., zinc ethoxide), a Zn carboxylate (e.g., zinc acetate), Zn nitrate, Zn percholate, Zn sulfate, Zn acetylacetonate, a Zn halide (e.g., zinc chloride, etc.), Zn cyanide, Zn hydroxide, or a combination thereof. Examples of the zinc precursor may be dimethyl zinc, diethyl zinc, zinc acetate, zinc acetylacetonate, zinc iodide, and zinc bromide, zinc chloride, zinc fluoride, zinc carbonate, zinc cyanide, zinc nitrate, zinc oxide, zinc peroxide, zinc perchlorate, zinc sulfate, or a combination thereof.

The selenium precursor may be selenium-trioctylphosphine (Se-TOP), selenium-tributylphosphine (Se-TBP), selenium-triphenylphosphine (Se-TPP), selenium-diphenylphosphine (Se-DPP), or a combination thereof, but is not limited thereto.

The sulfur precursor may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), sulfur-octadecene (S-ODE), bistrimethylsilyl sulfur, ammonium sulfide, sodium sulfide, or a combination thereof.

Examples of the organic solvent may include a C6 to C22 primary amine such as hexanedecylamine, a C6 to C22 secondary amine such as dioctylamine, trioctylamine, a C6 to C40 tertiary amine, a nitrogen-containing heterocyclic compound such as pyridine, a C6 to C40 olefin such as octadecene, a C6 to C40 aliphatic hydrocarbon such as hexadecane, octadecane, squalane, and the like, aromatic hydrocarbon substituted with a C6 to C30 alkyl group such as phenyldodecane, phenyltetradecane, phenyl hexadecane, primary, secondary, or tertiary phosphine substituted with a, e.g., at least one, (e.g., 1, 2, or 3) C6 to C22 alkyl group (e.g., trioctylamine), phosphine oxide substituted with a (e.g., 1, 2, or 3) C6 to C22 alkyl group (e.g., trioctylphosphine oxide), a C12 to C22 aromatic ether such as phenyl ether, benzyl ether, and the like, or a combination thereof.

The organic ligand may be coordinated on, e.g., bound to, the surface of the prepared nanocrystal and influence luminescence characteristics and electrical characteristics as well as aid dispersion of the nanocrystal in the solution. The details on the organic ligand are the same as described herein.

The reaction temperature for forming the core of the of quantum dots, the reaction temperature for forming the light emitting layer of the quantum dots, or the reaction temperature for forming each of the core and the light emitting layer of the of quantum dots may be greater than or equal to about 280° C., greater than or equal to about 290° C., greater than or equal to about 300° C., or greater than or equal to about 310° C. and less than or equal to about 350° C., for example, less than or equal to about 340° C. The reaction time for forming a core is not particularly limited, but may be appropriately selected depending upon a size of the core or a thickness of the light emitting layer.

The reaction conditions for forming the first shell of the quantum dot, the reaction conditions for forming the second shell of the quantum dot, or the reaction conditions for forming each of the first shell and the second shell of the quantum dot such as a reaction temperature, a time, and the like may be appropriately selected taking into consideration the desired shell composition. According to an embodiment, a solvent and optionally, an organic ligand is heated (e.g., under vacuum) at a predetermined temperature (e.g., greater than or equal to about 100° C.) under vacuum and substituted with an inert gas atmosphere and heated again at a predetermined temperature (e.g., greater than or equal to about 100° C.). Subsequently, the reaction is performed by adding a core, sequentially or simultaneously adding first shell precursors, and heating the same at a predetermined reaction temperature. The first shell precursors may form a shell of the desired composition (e.g., having a gradient or multi-layered) by sequentially adding a mixture at a different rate for a reaction time. In an embodiment, a zinc precursor and a selenium precursor are reacted to provide a first layer of a shell, and then a zinc precursor and a sulfur precursor are reacted to provide a second layer of a shell. The reaction temperature for forming the shell may be greater than or equal to about 280° C., for example, greater than or equal to about 290° C., or greater than or equal to about 300° C., and less than or equal to about 330° C., for example, less than or equal to about 325° C. The second shell is formed in accordance with the same procedure as in forming the first shell, except that second shell precursors for forming the second shell are sequentially added and reacted for the reaction time for the reaction time under a presence of the semiconductor nanocrystal in which the core and the shell are formed, and a light emitting layer is formed thereon, instead of the core.

The amount and the concentration of each precursor in the reaction system may be selected taking into consideration a desired core and shell composition and reactivity between precursors. For example, each ratio between precursors may be adjusted taking into consideration the desired composition (Zn, S, or Se) of the final quantum dots. The composition in the final quantum dots may be confirmed by an appropriate analysis means such as an inductively coupled plasma atomic emission spectrometer.

After completion of the reaction, a nonsolvent is added to the reaction product to separate the nanocrystalline particles coordinated with, e.g., bound to, the ligand compound. The nonsolvent may be a polar solvent that is miscible with the solvent used for the core formation reaction, the solvent used for the shell formation reaction, or each of the solvent used for the core formation reaction and the solvent used for the shell formation reaction but may not disperse the prepared nanocrystals. The nonsolvent may be selected depending on the solvent used in the reaction and may be for example, acetone, ethanol, butanol, isopropanol, ethanediol, water, tetrahydrofuran (THF), dimethylsulfoxide (DMSO), diethylether, formaldehyde, acetaldehyde, ethylene glycol, a solvent having a similar solubility parameter to the foregoing solvents, or a combination thereof. The separation may be performed through a centrifugation, precipitation, chromatography, or distillation. The separated nanocrystals may be added to the washing solvent and then washed as desired. The washing solvent is not particularly limited, and a solvent having a solubility parameter similar to that of the ligand may be used. Examples thereof may include hexane, heptane, octane, chloroform, toluene, and benzene.

An embodiment provides a composition including the aforementioned quantum dots. The composition may include (e.g., a plurality of) the aforementioned quantum dot(s); a dispersing agent (e.g., a binder polymer including a carboxylic acid group); and a (organic) solvent. The composition may further include a photopolymerizable monomer including a carbon-carbon double bond and optionally (thermal or photo) initiator.

The content of the aforementioned quantum dot in the composition may be appropriately adjusted taking into consideration a desirable final use (e.g., color filter, etc.). In an embodiment, the content of the quantum dot may be greater than or equal to about 1 weight percent (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt % based on a solid content of the composition. The content of the quantum dot may be less than or equal to about 70 wt %, for example, less than or equal to about 65 wt %, less than or equal to about 60 wt %, less than or equal to about 55 wt %, or less than or equal to about 50 wt % based on a solid content of the composition. The solid content of the present specification composition may represent the content of the corresponding component in the composite to be described herein.

The composition according to an embodiment may be used to produce a quantum dot-polymer composite or a pattern thereof. The composition according to an embodiment may be a quantum dot-containing photoresist composition to which a photolithography method may be applied. The composition according to an embodiment may be an ink composition that may provide a pattern by printing (e.g., a droplet discharge method such as inkjet printing). The composition according to an embodiment may not include a conjugated polymer (except a cardo binder that will be described herein). The composition according to an embodiment may include a conjugated polymer. Herein, the conjugated polymer refers to a polymer having a conjugation double bond in a main chain thereof (e.g., polyphenylenevinylene, etc.). The composition according to an embodiment may include a dispersing agent or a binder polymer. The binder polymer may include a carboxylic acid group.

The binder polymer may include a copolymer of a monomer combination including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group; a multiple aromatic ring-containing polymer having a backbone structure in which two aromatic rings are bound to a quaternary carbon atom that is a constituent atom of another cyclic moiety in the main chain and including a carboxylic acid group (—COOH) (hereinafter, referred to as a cardo binder); or a combination thereof.

The copolymer may include a first repeating unit derived from the first monomer and a second repeating unit derived from the second monomer, and optionally, may further include a third repeating unit derived from the third monomer.

The polymer including the carboxylic acid group may include a multiple aromatic ring-containing polymer. The multiple aromatic ring-containing polymer is known as a cardo binder resin and may commercially available.

The polymer including the carboxylic acid group may have an acid value of greater than or equal to about 50 milligrams of potassium hydroxide per gram (mg KOH/g). For example, the carboxylic acid group-containing polymer may have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, greater than or equal to about 110 mg KOH/g, greater than or equal to about 120 mg KOH/g, greater than or equal to about 125 mg KOH/g, or greater than or equal to about 130 mg KOH/g. The acid value of the polymer may be for example less than or equal to about 250 mg KOH/g, less than or equal to about for example, 240 mg KOH/g, less than or equal to about 230 mg KOH/g, less than or equal to about 220 mg KOH/g, less than or equal to about 210 mg KOH/g, less than or equal to about 200 mg KOH/g, less than or equal to about 190 mg KOH/g, less than or equal to about 180 mg KOH/g, or less than or equal to about 160 mg KOH/g, but is not limited thereto. The binder polymer may have a weight average molecular weight of greater than or equal to about 1,000 grams per mole (g/mol), for example, greater than or equal to about 2,000 g/mol, greater than or equal to about 3,000 g/mol, or greater than or equal to about 5,000 g/mol. The binder polymer may have a weight average molecular weight of less than or equal to about 100,000 g/mol, for example less than or equal to about 50,000 g/mol.

In the composition, a content of the dispersing agent or the binder polymer may be greater than or equal to about 0.5 wt %, greater than or equal to about 1 wt %, greater than or equal to about 5 wt %, greater than or equal to about 10 wt %, greater than or equal to about 15 wt %, or greater than or equal to about 20 wt % based on a total solid weight of the composition, but is not limited thereto. The content of the dispersing agent or the binder polymer may be for example less than or equal to about 55 wt %, less than or equal to about 40 wt %, less than or equal to about 30 wt %, less than or equal to about 33 wt %, or less than or equal to about 30 wt % based on a total solid weight of the composition.

In the composition, the polymerizable (e.g., photopolymerizable) monomer including the carbon-carbon double bond may include a (e.g., photopolymerizable) acryl-based monomer. A content of the monomer may be greater than or equal to about 0.5 wt %, for example, greater than or equal to about 1 wt %, or greater than or equal to about 2 wt % based on a total solid weight of the composition. The content of the photopolymerizable monomer may be less than or equal to about 50 wt %, for example, less than or equal to about 40 wt %, less than or equal to about 30 wt %, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt % based on a total solid weight of the composition.

The initiator in the composition may be used for polymerization of the monomers. The initiator is a compound accelerating a radical reaction (e.g., radical polymerization of monomer) by producing radical chemical species under a mild condition (e.g., by heat or light). The initiator may be a thermal initiator or a photo initiator. The initiator is a compound capable of initiating a radical polymerization of the polymerizable acrylic monomer, a thiol compound (that will be described herein), or a combination thereof by light. The type of the initiator is not particularly limited and may be appropriately selected.

In the composition, a content of the initiator may be appropriately adjusted taking into consideration the type and content of the used polymerizable monomer. In an embodiment, the content of the initiator may be about 0.01 wt % to about 10 wt % based on a total weight of the composition, but is not limited thereto.

The composition may further include a (multi- or mono-functional) thiol compound having a, e.g., at least one, thiol group at the end, a metal oxide particulate, or a combination thereof.

The metal oxide particulate may include $TiO_2$, $SiO_2$, $BaTiO_3$, $Ba_2TiO_4$, ZnO, or a combination thereof. A diameter of the metal oxide particulate is not particularly limited and may be selected appropriately. The diameter of the metal oxide particulate may be greater than or equal to about 100 nm, for example be greater than or equal to about 150 nm, or be greater than or equal to about 200 nm and less than or equal to about 1,000 nm, or less than or equal to about 800 nm. In the composition, the content of the metal oxide may be greater than or equal to about 1 wt %, greater than or equal to about 5 wt %, greater than or equal to about 10 wt %, or greater than or equal to about 15 wt % and less than or equal to about 35 wt %, less than or equal to about 30 wt %, less than or equal to about 20 wt %, less than or equal to about 10 wt %, or less than or equal to about 5 wt % based on the solid content of the composition.

The content of the polythiol compound may be greater than or equal to about 1 wt %, greater than or equal to about 5 wt %, greater than or equal to about 10 wt %, greater than or equal to about 15 wt %, or greater than or equal to about 20 wt % based on a total solid weight of the composition. The content of the polythiol compound may be less than or equal to about 50 wt %, less than or equal to about 40 wt %, less than or equal to about 30 wt %, less than or equal to about 25 wt %, less than or equal to about 20 wt %, or less than or equal to about 15 wt % based on a total solid weight of the composition.

The composition may further include an organic solvent (or a liquid vehicle). Types of the usable organic solvent are not particularly limited. The types and contents of the organic solvent may be appropriately determined by taking into consideration the aforementioned main components (i.e., the quantum dot, the dispersing agent, the polymerizable monomer, the initiator, and if used, the thiol compound) and a type and content of an additive which is described herein. The composition may include a solvent in a residual content except for a desired content of the (non-volatile) solid. If desired, the composition may further include various additives such as a light diffusing agent, a leveling agent, or a coupling agent in addition to the aforementioned components. The content of the additive is not particularly limited, and may be controlled within an appropriate range wherein the additive does not cause an adverse effect on preparation of the composition and production of the quantum dot-polymer composite and optionally a patterning of the composite.

If used, the additives may be used in an amount of greater than or equal to about 0.1 wt %, for example, greater than or equal to about 0.5 wt %, greater than or equal to about 1 wt %, greater than or equal to about 2 wt %, or greater than or equal to about 5 wt % based on a total weight of the composition, but is not limited thereto. If used, the content of the additives may be less than or equal to about 20 wt %, for example, less than or equal to about 19 wt %, less than or equal to about 18 wt %, less than or equal to about 17 wt %, less than or equal to about 16 wt %, or less than or equal to about 15 wt % based on a total weight of the composition, but is not limited thereto.

Details on the components of the composition and the preparation of the composition may refer to US-2017-0059988-A1, which is incorporated herein by reference in its entirety. The composition may provide a quantum dot-polymer composite (or a pattern thereof) by (e.g., radical) polymerization.

In an embodiment, a quantum dot-polymer composite includes a polymer matrix; and aforementioned quantum dot dispersed in the polymer matrix.

The polymer matrix may include a dispersing agent (e.g., a binder polymer including a carboxylic acid group), a polymerization product (e.g., insulating polymer) of a polymerizable monomer having a carbon-carbon double bond (at least one, for example, at least two, at least three, at least four, or at least five), or a combination thereof, and optionally a polymerization product of the polymerizable monomer and a polythiol compound having at least two thiol groups at a terminal end thereof. The quantum dot-polymer composite may further include the aforementioned metal oxide particulates.

In an embodiment, the polymer matrix may include a cross-linked polymer and a dispersing agent (e.g., (carboxyl group-contained) binder polymer). The polymer matrix may not include a conjugated polymer (excepting cardo resin). The cross-linked polymer may include a thiolene resin, a cross-linked poly(meth)acrylate, or a combination thereof. In an embodiment, the cross-linked polymer may be a polymerization product of the aforementioned polymerizable monomer, and optionally the polythiol compound.

The quantum dot, the dispersing agent, or the binder polymer, the polymerizable monomer, and the polythiol compound are the same as described herein. The contents of quantum dots and metal oxide particulates in the composite may be the aforementioned (based on solid content) contents in the composition. In the composite, the content of the polymer matrix may be greater than or equal to about 3 wt %, greater than or equal to about 5 wt %, greater than or equal to about 10 wt %, greater than or equal to about 15 wt %, or greater than or equal to about 20 wt % and less than or equal to about 97 wt %, less than or equal to about 95 wt %, less than or equal to about 90 wt %, less than or equal to about 80 wt %, or less than or equal to about 70 wt % based on a total weight of the composite.

The film of the quantum dot-polymer composite (or pattern that will be described herein) may have for example a thickness of less than or equal to about 30 micrometers (μm), for example, less than or equal to about 25 μm, less than or equal to about 20 μm, less than or equal to about 15 μm, less than or equal to about 10 μm, less than or equal to about 8 μm, or less than or equal to about 7 μm and greater than about 2 μm, for example, greater than or equal to about 3 μm, greater than or equal to about 3.5 μm, greater than or equal to about 4 μm, greater than or equal to about 5 μm, or greater than or equal to about 6 μm.

In an embodiment, a display device includes a light source and a photoluminescent element, e.g., a light emitting element, and the photoluminescent element includes a light emitting layer, and the light emitting layer includes a film or patterned film of the quantum dot-polymer composite. The light emitting layer may be disposed on a (e.g., transparent) substrate. The light source is configured to provide the photoluminescent element with incident light. The incident light may have a photoluminescence peak wavelength of greater than or equal to about 440 nm, for example, greater than or equal to about 450 nm and less than or equal to about 500 nm, for example, less than or equal to about 480 nm, less than or equal to about 470 nm, or less than or equal to about 460 nm.

Figure 2:
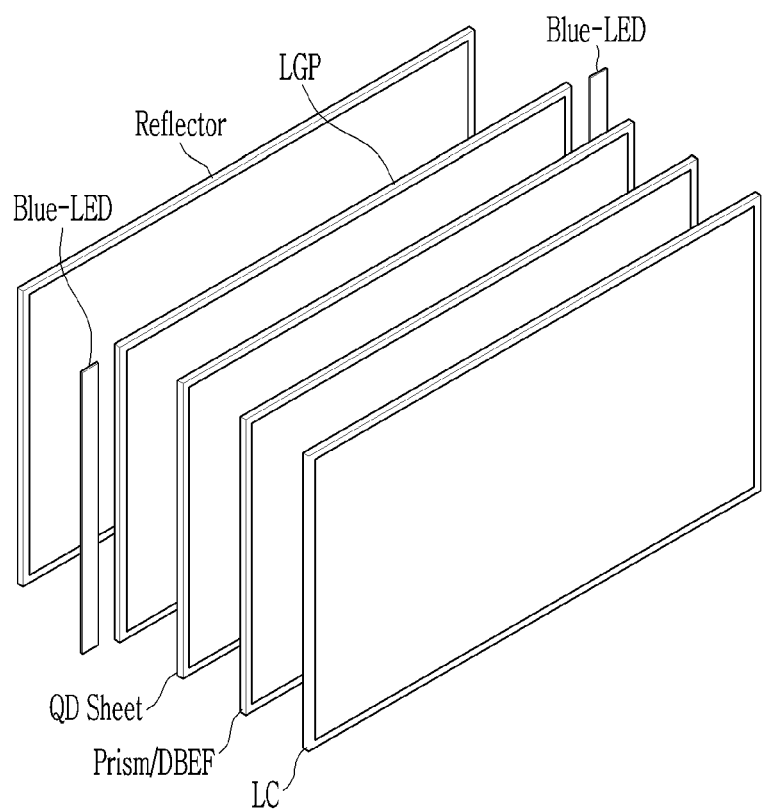
FIG. 2 is an exploded view of a device according to an embodiment.

In embodiment, the luminescent element may include a sheet of the quantum dot polymer composite. The display device may further include a liquid crystal panel and the sheet of the quantum dot-polymer composite may be disposed between the light source and the liquid crystal panel. FIG. 2 shows an exploded view of a non-limiting display device. Referring to FIG. 2, the display device may have a structure wherein a reflector, a light guide panel (LGP) and a blue LED light source (Blue-LED), the aforementioned quantum dot-polymer composite sheet (QD sheet), for example, various optical films such as a prism, a dual brightness enhancement film (DBEF), and the like are stacked and a liquid crystal (LC) panel is disposed thereon.

In the device of an embodiment, the light emitting layer may include a pattern of the quantum dot-polymer composite. The pattern may include a, e.g., at least one, repeating section to emit light at a predetermined wavelength. The pattern of the quantum dot-polymer composite may include a first section to emit first light and a second section to emit second light. The pattern of the quantum dot-polymer composite may be produced by photolithography or inkjet.

The first light and the second light have different maximum emission peak wavelengths in a photoluminescence spectrum. In an embodiment, the first light may be red light having a maximum emission peak wavelength of about 600 nm to about 650 nm (e.g., about 620 nm to about 650 nm), and the second light may be green light having a maximum emission peak wavelength of about 500 nm to about 550 nm (e.g., about 510 nm to about 550 nm) or vice versa (i.e., the first light is green light and the second light is red light). The pattern may further include a third section that emits or passes third light (e.g., blue light) that is different from the first light and the second light. The third light may have a maximum peak wavelength ranging from about 380 nm to about 480 nm.

Optical elements (blue light blocking layer or first optical filter which will be described herein) for blocking (e.g., reflecting or absorbing) blue light may be disposed on front surfaces (light-emitting surfaces) of the first section and the second section.

In the aforementioned display device, the light source includes a plurality of light emitting units respectively corresponding to the repeating sections (e.g., first section and second section), and the light emitting units may include a first electrode and a second electrode facing each other and an electroluminescent layer disposed between the first electrode and the second electrode. The electroluminescent layer may include an organic light emitting material. For example, each light emitting unit of the light source may include an electroluminescent device (e.g., an organic light emitting diode (OLED)) structured to emit light of a predetermined wavelength (e.g., blue light, green light, or a combination thereof). Structures and materials of the electroluminescent device and the organic light emitting diode (OLED) are known but not particularly limited. The light source includes an organic light emitting diode (OLED) emitting blue light (and optionally, green light).

Figure 3A:
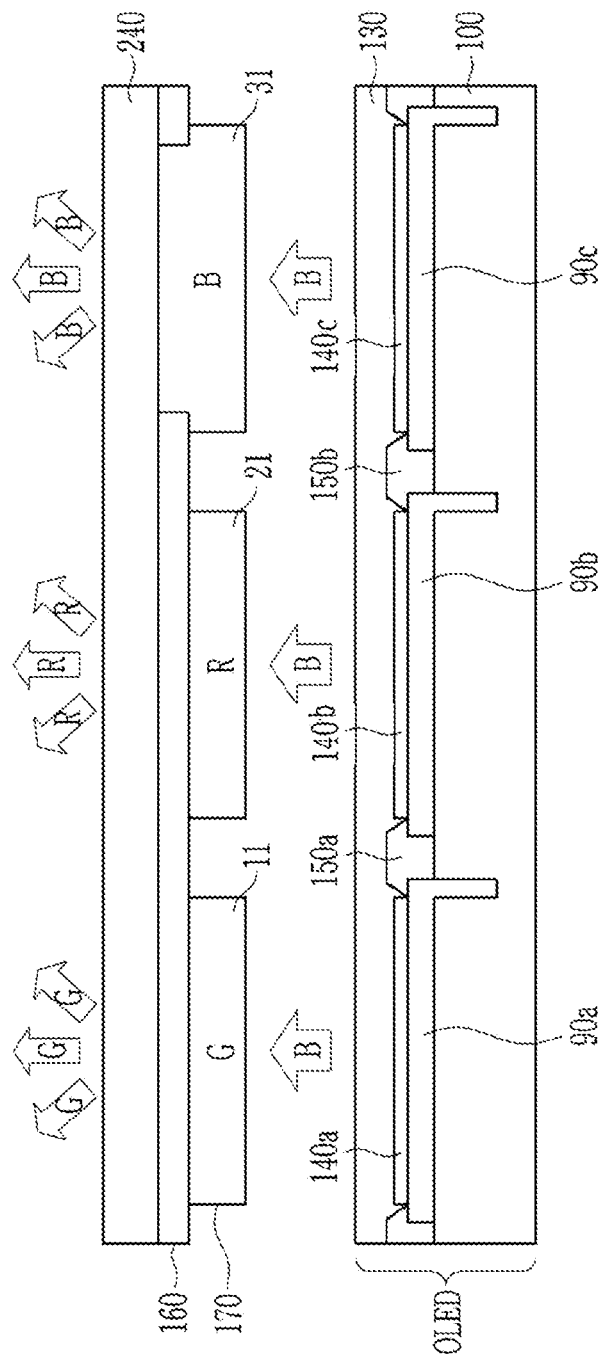
FIG. 3A is a schematic view showing a cross section of a device of an embodiment.
Figure 3B:
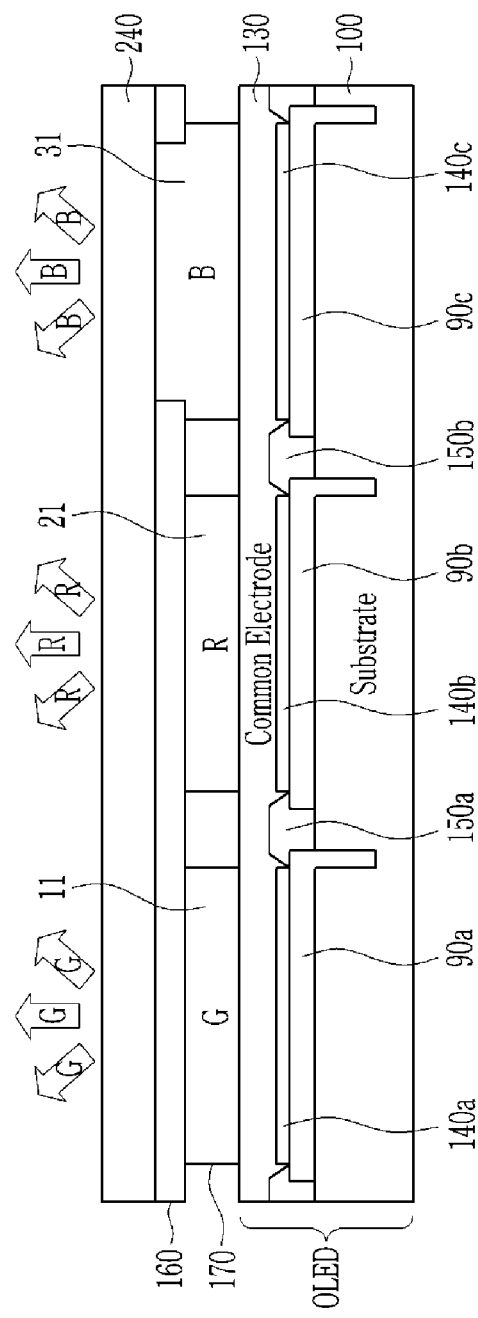
FIG. 3B is a schematic view showing a cross section of a device of an embodiment.

FIG. 3A is a schematic cross-sectional view of a display device according to an embodiment, and FIG. 3B is a schematic cross-sectional view of a display device according to an embodiment. Referring to FIGS. 3A and 3B, a light source includes an organic light emitting diode (OLED) emitting blue light.

The organic light emitting diode (OLED) may include at least two pixel electrodes 90a, 90b, and 90c on a substrate 100, pixel define layers 150a, 150b formed between neighboring pixel electrodes 90a, 90b, and 90c, organic emission layers 140a, 140b, and 140c on each pixel electrode, and a common electrode 130 layer formed on the organic emission layers.

The substrate 100 may include an insulating material and may have flexibility. Details of the substrate are the same as described herein.

A line layer including a thin film transistor or the like is formed on the substrate. The line layer may further include a gate line, a sustain voltage line, a gate insulating layer, a data line, a source electrode, a drain electrode, a semiconductor, a protective layer, and the like. The detail structure of the line layer may be verified according to an embodiment. The gate line and the sustain voltage line are electrically separated from each other, and the data line is insulated and crosses the gate line and the sustain voltage line. The gate electrode, the source electrode, and the drain electrode form a control terminal, an input terminal, and an output terminal of the thin film transistor, respectively. The drain electrode is electrically connected to the pixel electrode that will be described herein.

The pixel electrodes 90a, 90b, and 90c may function as an anode of the display device. The pixel electrode may include a transparent conductive material such as indium tin oxide (ITO) or indium zinc oxide (IZO). The pixel electrode may include a material having a light-blocking properties such as gold (Au), platinum (Pt), nickel (Ni), tungsten (W), chromium (Cr), molybdenum (Mo), iron (Fe), cobalt Co), copper (Cu), palladium (Pd), titanium (Ti), and the like. The pixel electrode may have a two-layered structure in which the transparent conductive material and the material having light-blocking properties are stacked sequentially.

Between two adjacent pixel electrodes, a pixel define layer (PDL) 150a, 150b overlaps with a terminal end of the pixel electrode to divide the pixel electrode into a pixel unit. The pixel define layer is an insulating layer which may electrically block the at least two pixel electrodes.

The pixel define layer covers a part of the upper surface of the pixel electrode, and the remaining region of the pixel electrode that is not covered by the pixel define layer may provide an opening. An organic emission layer 140a, 140b, and 140c which will be described herein may be formed on the region defined by the opening.

The organic emission layer 140a, 140b, and 140c defines each pixel area by the pixel electrode and the pixel define layer. In other words, one pixel area may be defined as an area including one organic emission unit layer which is contacted with one pixel electrode divided by the pixel define layer.

For example, in the display device according to an embodiment, the organic emission layer may be defined as a first pixel area, a second pixel area, and a third pixel area, and each pixel area is spaced apart from each other leaving a predetermined interval by the pixel define layer.

The organic emission layer may emit a third light belonging to visible light region or belonging to an ultraviolet (UV) region. That is, each of the first to the third pixel areas of the organic emission layer may emit a third light. In an embodiment, the third light may be a light having the highest energy in the visible light region, for example, blue light. When all pixel areas of the organic emission layer are designed to emit the same light, each pixel area of the organic emission layer may include the same or similar materials or may have the same or similar properties. Thus a process of forming the organic emission layer may be simplified, and the organic emission layer may be formed by large scale/large area applications, e.g., processes. However, the organic emission layer according to an embodiment is not necessarily limited thereto, but the organic emission layer may be designed to emit at least two different lights.

The organic light emitting layer includes an organic emission unit layer in each pixel area, and each organic emission unit layer may further include an auxiliary layer (e.g., hole injection layer, hole transport layer, electron transport layer, etc.) in addition to the light emitting layer.

The common electrode 130 may function as a cathode of the display device. The common electrode may include a transparent conductive material such as indium tin oxide (ITO) or indium zinc oxide (IZO). The common electrode may be formed on the organic emission layer 140a, 140b, and 140c and may be integrated therewith.

A planarization layer or a passivation layer (not shown) may be formed on the common electrode. The planarization layer may include a (e.g., transparent) insulating material for ensuring electrical insulation with the common electrode.

A stack structure is disposed on the light source and the stack structure includes the pattern of the quantum dot polymer composite 170 (e.g., a first section 21 including a red quantum dot and a second section 11 including a green quantum dot) and a substrate. The blue light emitted from a light source enters the first section and the second section to emit red and green light respectively. The blue light emitted from a light source may transmit the third section 31.

This device may be manufactured by separately manufacturing the disclosed stack structure and (e.g., blue light-emitting) OLED and then assembling them. The device may be manufactured by directly forming a quantum dot polymer composite pattern on the OLED.

In the device according to an embodiment, an optical element blocking (e.g., reflecting or absorbing) blue light 160 may be disposed on the first section emitting red light and the second section emitting green light. The optical element blocking blue light 160 may include a blue light reflection layer, a blue light absorption layer, or a combination thereof. The optical element blocking blue light 160 may include a blue cut filter, a polymer layer including a yellow dye, or a combination thereof, and the blue light blocking layer may be disposed on a substrate. The blue light blocking layer 160 may be disposed on the first section and the second section between the substrate and the quantum dot-polymer composite pattern. A detailed description of the blue light blocking layer is the same as that of a first optical filter 310 which will be described herein.

In an embodiment, the display device may further include a lower substrate, a polarizing plate disposed under the lower substrate, and a liquid crystal layer disposed between the stacked structure and the lower substrate, and in the stacked structure, the photoluminescent layer may be disposed to face the liquid crystal layer. The display device may further include a polarizing plate between the liquid crystal layer and the photoluminescent layer. The light source may further include LED and if desired, a light guide panel.

Figure 4:
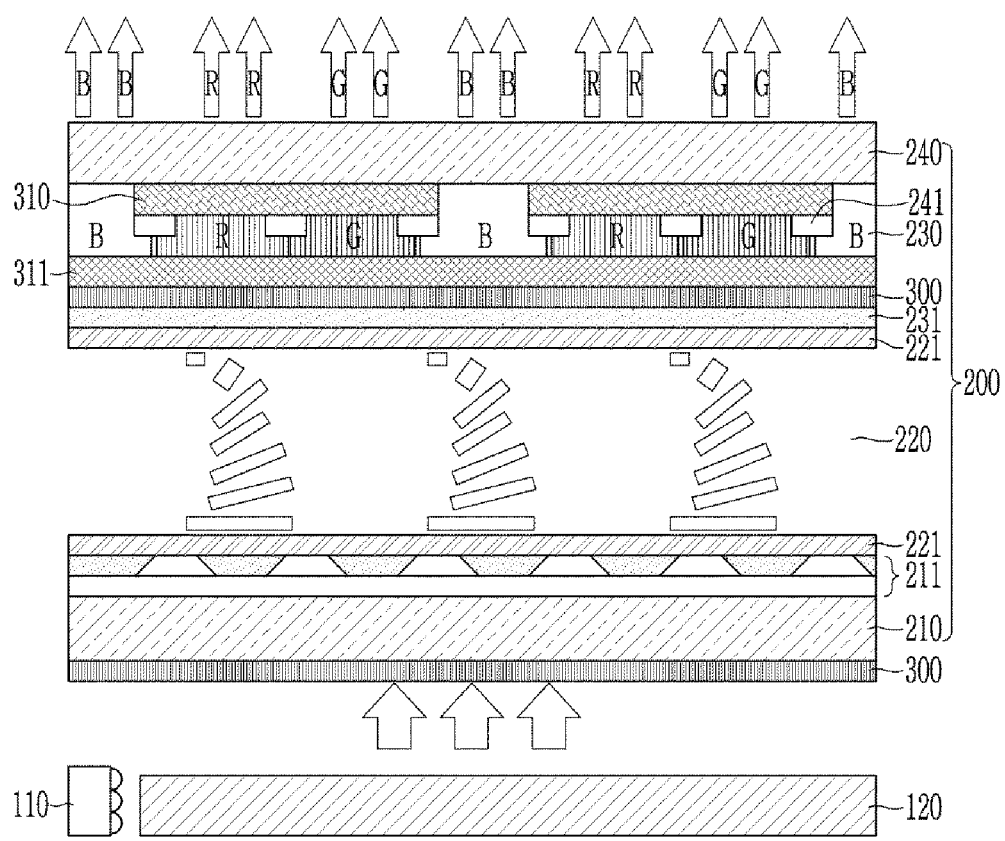
FIG. 4 is a schematic view showing a cross section of a display device of an embodiment.

Non-limiting examples of the display device (e.g., a liquid crystal display device) according to an embodiment are illustrated with reference to a drawing. FIG. 4 is a schematic cross sectional view showing a liquid crystal display according to an embodiment. Referring to FIG. 4, the display device of an embodiment includes a liquid crystal panel 200, a polarizing plate 300 disposed under the liquid crystal panel 200, and a backlight unit (BLU) disposed under the polarizing plate 300.

The liquid crystal panel 200 includes a lower substrate 210, a stacked structure, and a liquid crystal layer 220 disposed between the stacked structure and the lower substrate. The stacked structure includes a transparent substrate 240 and a photoluminescent layer 230 including a pattern of a quantum dot-polymer composite.

The lower substrate 210 that is also referred to as an array substrate may be a transparent insulating material substrate. The substrate is the same as described herein. A wire plate 211 is provided on an upper surface of the lower substrate 210. The wire plate 211 may include a plurality of gate wires (not shown) and data wires (not shown) that define a pixel area, a thin film transistor disposed adjacent to a crossing region of gate wires and data wires, and a pixel electrode for each pixel area, but is not limited thereto. Details of such a wire plate are known and are not particularly limited.

The liquid crystal layer 220 may be disposed on the wire plate 211. The liquid crystal layer 220 may include an alignment layer 221 on and under the layer 220 to initially align the liquid crystal material included therein. Details (e.g., a liquid crystal material, an alignment layer material, a method of forming liquid crystal layer, a thickness of liquid crystal layer, or the like) of the liquid crystal material and the alignment layer are known and are not particularly limited.

A lower polarizing plate 300 is provided under the lower substrate. Materials and structures of the polarizing plate 300 are known and are not particularly limited. A backlight unit (e.g., emitting blue light) may be disposed under the polarizing plate 300.

An upper optical element or an upper polarizing plate 300 may be provided between the liquid crystal layer 220 and the transparent substrate 240, but is not limited thereto. For example, the upper polarizing plate may be disposed between the liquid crystal layer 220 and the photoluminescent layer 230. The polarizing plate may be any polarizer that used in a liquid crystal display device. The polarizing plate may be TAC (triacetyl cellulose) having a thickness of less than or equal to about 200 micrometers (μm), but is not limited thereto. In an embodiment, the upper optical element may be a coating that controls a refractive index without a polarization function.

The backlight unit includes a light source 110. The light source may emit blue light or white light. The light source may include a blue LED, a white LED, a white OLED, or a combination thereof, but is not limited thereto.

The backlight unit may further include a light guide panel 120. In an embodiment, the backlight unit may be an edge-type lighting. For example, the backlight unit may include a reflector (not shown), a light guide panel (not shown) provided on the reflector and providing a planar light source with the liquid crystal panel 200, a, e.g., at least one, optical sheet (not shown) on the light guide panel, for example, a diffusion plate, a prism sheet, and the like, or a combination thereof, but is not limited thereto. The backlight unit may not include a light guide panel. In an embodiment, the backlight unit may be a direct lighting. For example, the backlight unit may have a reflector (not shown), and may have a plurality of fluorescent lamps disposed on the reflector at regular intervals, or may have an LED operating substrate on which a plurality of light emitting diodes may be disposed, a diffusion plate thereon, and optionally a, e.g., at least one, optical sheet. Details (e.g., each component of a light emitting diode, a fluorescent lamp, light guide panel, various optical sheets, and a reflector) of such a backlight unit are known and are not particularly limited.

A black matrix (BM) 241 is provided under the transparent substrate 240 and the black matrix 241 has openings and hides a gate line, a data line, and a thin film transistor of the wire plate on the lower substrate. For example, the black matrix 241 may have a lattice shape. The photoluminescent layer 230 is provided in the openings of the black matrix 241 and has a quantum dot-polymer composite pattern including a first section (R) configured to emit first light (e.g., red light), a second section (G) configured to emit second light (e.g., green light), and a third section (B) configured to emit/transmit, for example blue light. If desired, the photoluminescent layer may further include a, e.g., at least one, fourth section. The fourth section may include a quantum dot that emits different color from light emitted from the first to third sections (e.g., cyan, magenta, and yellow light).

In the photoluminescent layer 230, sections forming a pattern may be repeated corresponding to pixel areas formed on the lower substrate. A transparent common electrode 231 may be provided on the photoluminescent color filter layer.

The third section (B) configured to emit/transmit blue light may be a transparent color filter that does not change a photoluminescence spectrum of the light source. Blue light emitted from the backlight unit may enter in a polarized state and may be emitted through the polarizing plate and the liquid crystal layer as is. If desired, the third section may include a quantum dot emitting blue light.

Optionally, the display device may further have a blue light blocking layer (blue cut filter) or a first optical filter 310 layer. The blue light blocking layer may be disposed between bottom surfaces of the first section (R) and the second section (G) and the upper substrate 240, or on the top surface of the upper substrate 240. The blue light blocking layer may be a sheet having openings that correspond to a pixel area showing, e.g., emitting, a blue color (e.g., third section) and may be formed on portions corresponding to the first and second sections. That is, the first optical filter layer may be integrally formed as one body structure at the portions except portions overlapped with the third section as shown in FIG. 4, but is not limited thereto. At least two first optical filter layers 310 and 311 may be spaced apart and be disposed on each of the portions overlapped with the first and the second sections.

For example, the first optical filter layer may block light having a portion of a wavelength region in the visible light region and transmit light having other wavelength regions. For example, the first optical filter layer may block blue light and transmit light except blue light. For example, the first optical filter layer may transmit green light, red light, and/or or yellow light that is mixed light thereof.

For example, the first optical filter layer may substantially block blue light having a wavelength of less than or equal to about 500 nm and may transmit light in another visible light wavelength region of greater than about 500 nm and less than or equal to about 700 nm.

For example, the first optical filter layer may have light transmittance of greater than or equal to about 70%, greater than or equal to about 80%, greater than or equal to about 90%, or about 100% with respect to the other visible light of greater than about 500 nm and less than or equal to about 700 nm.

The first optical filter layer may include a polymer thin film including a dye that absorbs light having a wavelength to be blocked, a pigment that absorbs light having a wavelength to be blocked, or a combination thereof. The first optical filter layer may block at least 80%, at least 90%, or at least 95% of blue light having a wavelength of less than or equal to about 480 nm and the first optical filter layer may have light transmittance of greater than or equal to about 70%, greater than or equal to about 80%, greater than or equal to about 90%, or about 100% with respect to other visible light of greater than about 500 nm and less than or equal to about 700 nm.

The first optical filter layer may substantially block (e.g., absorb) blue light having a wavelength of less than or equal to about 500 nm and for example may selectively transmit green light or red light. At least two first optical filter layers may be spaced apart and disposed on each of the portions overlapped with the first and second sections, respectively. For example, a first optical filter layer selectively transmitting red light may be disposed on the portion overlapped with the section emitting red light and the first optical filter layer selectively transmitting green light may be disposed on the portion overlapped with the section emitting green light, respectively. For example, the first optical filter layer may include a first region, a second region, or a combination thereof wherein the first region blocks (e.g., absorb) blue light and red light and transmits light having a wavelength of a predetermined range (e.g., greater than or equal to about 500 nm, greater than or equal to about 510 nm, or greater than or equal to about 515 nm and less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm) and the second region blocks (e.g., absorb) blue light and green light and transmits light having a wavelength of a predetermined range (e.g., greater than or equal to about 600 nm, greater than or equal to about 610 nm, or greater than or equal to about 615 nm and less than or equal to about 650 nm, less than or equal to about 645 nm, less than or equal to about 640 nm, less than or equal to about 635 nm, less than or equal to about 630 nm, less than or equal to about 625 nm, or less than or equal to about 620 nm). The first region may be disposed at a place overlapped with the section emitting green light and the second region may be disposed at a place overlapped with the section emitting red light. The first region and the second region may be optically isolated. The first optical filter layer may contribute to improving color purity of a display device.

The first optical filter layer may be a reflective filter including a plurality of layers (e.g., inorganic material layers) with different refractive index. For example two layers having different refractive index may be alternately stacked with each other, or for example a layer having a high refractive index and a layer having a low refractive index may be alternately stacked with each other As a refractive index difference between the layer having a high refractive index and the layer having a low refractive index is higher, the first optical filter layer having higher wavelength selectivity may be provided. A thickness and the stacked number of the layer having a high refractive index and the layer having a low refractive index may be determined according to a refractive index of each layer and a reflected wavelength, for example, each layer having a high refractive index may have a thickness of about 3 nm to about 300 nm, and each layer having a low refractive index may have a thickness of about 3 nm to about 300 nm.

A total thickness of the first optical filter layer may be, for example, from about 3 nm to about 10,000 nm, about 300 nm to about 10,000 nm, or about 1,000 nm to about 10,000 nm. All layers having a high refractive index may have the same thickness and the same material or different from each other, and all layers having a low refractive index may have the same thickness and the same material or different from each other.

The display device may further include a second optical filter layer (e.g., red/green or yellow light recycling layer) 311 disposed between the photoluminescent layer and the liquid crystal layer (e.g., between photoluminescent layer and upper polarizer) and transmitting at least a portion of the third light and reflecting at least a portion of the first light and the second light. The second optical filter layer 311 may reflect light in a wavelength region of greater than about 500 nm. The first light may be red light, the second light may be green light, and the third light may be blue light.

In the display device according to an embodiment, the second optical filter layer may be formed as an integrated one layer having a relatively planar surface.

In an embodiment, the second optical filter layer may include a monolayer having a low refractive index, for example, the second optical filter layer may be a transparent thin film having a refractive index of less than or equal to about 1.4, less than or equal to about 1.3, or less than or equal to about 1.2.

The second optical filter layer having a low refractive index may be, for example, a porous silicon oxide, a porous organic material, a porous organic/inorganic composite, or a combination thereof.

In an embodiment, the second optical filter layer may include a plurality of layers having different refractive indexes, for example, the second optical filter layer may be formed by alternately stacking two layers having different refractive indexes, or for example, the second optical filter layer may be formed by alternately stacking material having a high refractive index and material having a low refractive index.

The layer having a high refractive index in the second optical filter layer may include, for example, hafnium oxide, tantalum oxide, titanium oxide, zirconium oxide, magnesium oxide, cesium oxide, lanthanum oxide, indium oxide, niobium oxide, aluminum oxide, and silicon nitride, or a combination thereof but according to an embodiment, the layer having a high refractive index in the second optical filter layer may include a variety of materials having a higher refractive index than the layer having a low refractive index.

The layer having a low refractive index in the second optical filter layer may include, for example, a silicon oxide, but according to an embodiment, the layer having a low refractive index in the second optical filter layer may include may include a variety of materials having a lower refractive index than the layer having a high refractive index.

As the refractive index difference between the layer having a high refractive index and the layer having a low refractive index is the higher, the second optical filter layer may have the higher wavelength selectivity.

In the second optical filter layer, each thickness of the layer having a high refractive index and the layer having a low refractive index and the stacked number thereof may be determined depending upon a refractive index of each layer and the reflected wavelength, for example, each layer having a high refractive index in the second optical filter layer may have a thickness of about 3 nm to about 300 nm, and each layer having a low refractive index in the second optical filter layer may have a thickness of about 3 nm to about 300 nm. A total thickness of the second optical filter layer may be, for example, from about 3 nm to about 10,000 nm, about 300 nm to about 10,000 nm, or about 1,000 nm to about 10,000 nm. Each of the layer having a high refractive index and the layer having a low refractive index in the second optical filter layer may have the same thickness and materials or different thickness and materials from each other.

The second optical filter layer may reflect at least a portion of the first light (R) and the second light (G) and transmits at least a portion (e.g., whole part) of the third light (B). For example, the second optical filter layer 140 may transmit only the third light (B) in a blue light wavelength region of less than or equal to about 500 nm and light in a wavelength region of greater than about 500 nm, that is, green light (G), yellow light, red light (R), and the like may be not passed through the second optical filter layer and reflected. Thus the reflected green light and red light may pass through the first and the second sections to be emitted to the outside of the display device.

The second optical filter layer may reflect a wavelength region of greater than about 500 nm in greater than or equal to about 70%, greater than or equal to about 80%, or greater than or equal to about 90%, or about 100%.

The second optical filter layer may have a transmittance to a wavelength region of less than or equal to about 500 nm of, for example, greater than or equal to about 90%, greater than or equal to about 92%, greater than or equal to about 94%, greater than or equal to about 96%, greater than or equal to about 98%, greater than or equal to about 99%, or about 100%.

In an embodiment, the aforementioned quantum dot-polymer composite pattern may be produced by a method using the photoresist composition. The method may include forming a film of the aforementioned composition on a substrate; exposing a selected region of the film to light (e.g., a wavelength of less than or equal to about 400 nm); and developing the exposed film with an alkali developing solution to obtain a pattern of the quantum dot-polymer composite.

Figure 5:
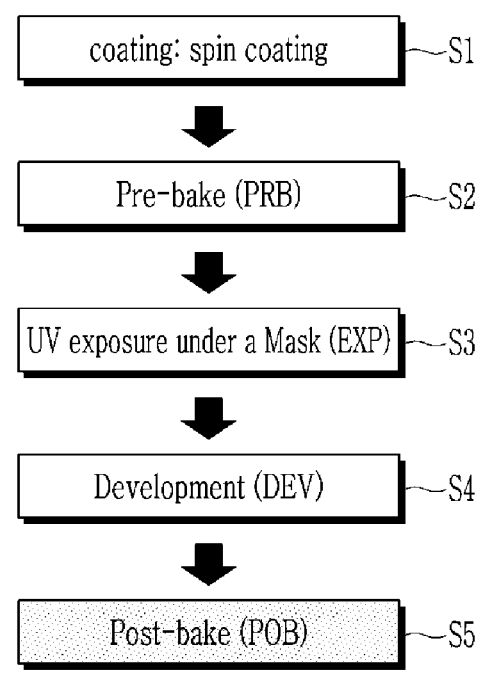
FIG. 5 is a schematic view showing a pattern forming process using a composition according to an embodiment.
Figure 5:
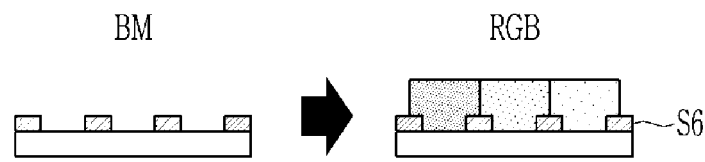

The substrate and the composition are the same as described herein. Non-limiting methods of forming the aforementioned pattern are illustrated, referring to FIG. 5.

The aforementioned composition is coated to have a predetermined thickness on a substrate in an appropriate method of spin coating, slit coating, and the like (S1). The formed film may be, optionally, pre-baked (PRB) (S2). The prebaking may be performed by selecting an appropriate condition from known conditions of a temperature, time, an atmosphere, and the like.

The formed (or optionally pre-baked) film is exposed to light having a predetermined wavelength under a mask having a predetermined pattern (S3). A wavelength and intensity of the light may be selected taking into consideration types and contents of the photoinitiator, types and contents of the quantum dots, and the like.

The exposed film is treated with an alkali developing solution (e.g., dipping or spraying) to dissolve an unexposed region and obtain a desired pattern (S4). The obtained pattern may be, optionally, post-baked (POB) to improve crack resistance and solvent resistance of the pattern (S5), for example, at a temperature of greater than or equal to about 150° C., for example, greater than or equal to about 180° C. and less than or equal to about 230° C., for example, less than or equal to about 200° C. for a predetermined time (e.g., greater than or equal to about 10 minutes or greater than or equal to about 20 minutes). The quantum dot-polymer composite including the quantum dot of an embodiment may exhibit a blue light conversion rate of greater than or equal to about 29%, for example, greater than or equal to about 30%, or greater than or equal to about 31%, for example, after 30 minutes heat treatment at 180° C.

When the quantum dot-polymer composite pattern has a plurality of repeating sections, the quantum dot-polymer composite having a desired pattern may be obtained by preparing a plurality of compositions including a quantum dot having desired photoluminescence properties (a photoluminescence peak wavelength and the like) to form each repeating section (e.g., a red light emitting quantum dot, a green quantum dot, or optionally, a blue quantum dot) and repeating the aforementioned pattern formation process for each composition an appropriate number of times (e.g., twice or more or three times or more) (S6). For example, the quantum dot-polymer composite may have a pattern of at least two repeating color sections (e.g., RGB sections). This quantum dot-polymer composite pattern may be used as a photoluminescence-type color filter in a display device.

In an embodiment, the aforementioned stacked structure may be produced using an ink composition. The method may include depositing the same (e.g., so as to provide a desirable pattern) on the desirable substrate using an appropriate system (e.g., droplet discharging device such as inkjet or nozzle printing device) and heating the same to remove a solvent and to perform a polymerization. The method may provide a highly precise quantum dot-polymer composite film or pattern in a simple way for a short time.

An embodiment provides an electronic device including the aforementioned quantum dot. The device may include a light emitting diode (LED), an organic light emitting diode (OLED), a sensor, a solar cell, an imaging sensor, or a liquid crystal display (LCD), but is not limited thereto.

Hereinafter, the embodiments are illustrated in more detail with reference to examples. However, they are exemplary embodiments of the present invention, and the present invention is not limited thereto.

EXAMPLES

Analysis Methods

1. Ultraviolet-Visible (UV-Vis) Spectroscopy

Ultraviolet (UV) spectroscopy is performed by using an Agilent Cary5000 spectrometer to obtain a UV-Visible absorption spectrum.

2. Photoluminescence Analysis

Using a Hitachi F-7000 spectrometer, photoluminescence (PL) spectra of the produced quantum dots at excitation wavelength of 450 nanometers (nm) are obtained.

3. Inductively Coupled Plasma (ICP) Analysis

Using Shimadzu ICPS-8100, an inductively coupled plasma atomic emission spectroscopy (ICP-AES) is performed.

4. Optical Density (OD) per Unit Weight at Wavelength of 450 nm

Synthesized quantum dot (QD) particles are washed, and then, QD powder is weighed. A weight of b grams of toluene is added to a weight of a grams of the QD powder to prepare a QD solution (a+b grams).

The QD solution is n times diluted with toluene and then, put in a 1 centimeter (cm) quartz cuvette, and an Agilent Cary5000 spectrometer is used to perform an UV spectroscopy. In the measured UV spectrum, an absorbance of 450 nm is measured and used to obtain total OD according to the following equation:

$$\text{Absorbance} \times n \times (a+b) \text{gram}.$$

The obtained total OD is divided by the dry QD powder weight (b) (i.e., absorbance×dilution ratio (n times)×(QD+gram of solvent)/gram of QD) to obtain optical density per QD unit weight.

Synthesis Example 1: Preparation of InP Core

Indium acetate and palmitic acid are dissolved in 1-octadecene in a 200 milliliter (mL) reaction flask and then, heated at 120° C. under vacuum. A mole ratio of indium and palmitic acid is 1:3. After 1 hour, an atmosphere in the reactor is converted into nitrogen. After heating the reactor at 280° C., a mixed solution of tris(trimethylsilyl)phosphine (TMS3P) and trioctylphosphine is rapidly injected thereinto and then, reacted for 20 minutes. The reaction solution is rapidly cooled down to room temperature, acetone is added thereto, and precipitates obtained by centrifuging the mixture are dispersed again in toluene. A content of TMS3P is 0.5 mole based on 1 mole of indium. The obtained InP core has a size of about 2.08 nm.

Comparative Example 1: Preparation of InP/ZnSe/ZnS Quantum Dot

1. Preparation of Quantum Dot of Core/Shell Structure

Se/TOP stock solution and S/TOP stock solution are prepared by dispersing selenium and sulfur in trioctylphosphine (TOP), respectively.

0.6 millimoles (mmol) of zinc acetate and 1.2 mmol of oleic acid are dissolved in 10 mL of trioctylamine in a 200 mL reaction flask and vacuumed at 120° C. for 10 minutes. After substituting the inside of the reaction flask with $N_2$, the toluene dispersion of the InP semiconductor nanocrystal synthesized from Synthesis Example 1 is rapidly added thereto while increasing a temperature of the obtained solution up to 280° C. and a predetermined amount of the produced Se/TOP stock solution is added thereto, and a reaction is performed for 30 minutes to provide a ZnSe layer on the InP core.

Subsequently, the S/TOP stock solution is added together with zinc acetate to the reaction solution at the reaction temperature and reacted for 30 minutes to provide a reaction solution including InP/ZnSe/ZnS quantum dots in which a ZnS layer is formed on the ZnSe layer.

An excess amount of ethanol is added to the reaction solution including the InP/ZnSe/ZnS quantum dots and the resultant is centrifuged. After the centrifuge, the supernatant is discarded, and the precipitate is dried and then dispersed in chloroform or toluene to provide a InP/ZnSe/ZnS quantum dot solution (hereinafter, QD solution).

The amounts of the Se precursor and the S precursor used for preparing the shell are 0.2 moles (mol) and 0.1 mol, respectively, and the amount of the used Zn precursor is 0.6 mol.

(2) A diameter of the obtained quantum dot and thicknesses of the ZnSe shell and the ZnS shell in the quantum dots may be calculated from the composition ratio obtained through ICP, and the results are shown in Table 1. In addition, the emission peak wavelength of the obtained quantum dots and OD per particle are measured, and the results are shown in Table 1.

2. Production of Quantum Dot-Polymer Composite and Pattern Thereof (1) Preparation of Quantum Dot-Binder Dispersion Chloroform dispersion of the obtained quantum dot is mixed with a binder (a tetracopolymer of methacrylic acid, benzyl methacrylate, hydroxyethylmethacrylate, and styrene, an acid value of 130 milligrams of potassium hydroxide per gram (mg KOH/g), a molecular weight: of 8,000 grams per mole (g/mol), a mole ratio of methacrylic acid: benzyl methacrylate:hydroxyethylmethacrylate:styrene=61.5%:12%:16.3%:10.2%) solution (polypropylene glycol monomethyl ether acetate in 30 weight percent (wt %) of a concentration) to prepare quantum dot-binder dispersion.

(2) Preparation of Photosensitive Composition

The quantum dot binder dispersion is mixed with hexaacrylate having the following structure as a photopolymerizable monomer, glycoldi-3-mercaptopropionate (hereinafter, 2T), an oxime ester compound as an initiator, and TiO$_2$ as a metal oxide particulate and PGMEA to prepare a composition.

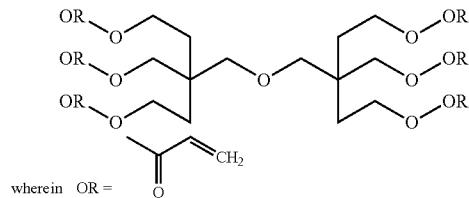

wherein OR =

The composition includes 40 wt % of the quantum dot, 12.5 wt % of the binder polymer, 25 wt % of 2T, 12 wt % of the photopolymerizable monomer, 0.5 wt % of the initiator, and 10 wt % of the light diffusing agent based on a solid content of the composition, and a total solid content is 25%.

(3) Production of Quantum Dot-Polymer Composite Pattern and Heat Treatment

The photosensitive composition is spin-coated on a glass substrate at 150 rpm for 5 seconds to obtain a film. The film is pre-baked (PRB) at 100° C. These pre-baked films are exposed to irradiation of light (wavelength: 365 nm, intensity: 100 millijoules (mJ)) for 1 second under a mask having a predetermined pattern (e.g., a square dot or stripe pattern), developed in a potassium hydroxide aqueous solution (concentration: 0.043%) for 50 seconds to obtain quantum dot-polymer composite patterns (thickness: 6 µm).

The obtained pattern is heat-treated (POB) at 180° C. for 30 minutes under a nitrogen atmosphere.

With respect to the obtained film pattern, emission peak wavelength and blue light absorption rate are measured, and the result is shown in Table 1.

Comparative Example 2: Preparation of InP/ZnSe/InP Quantum Dot

A ZnSe shell is formed on the InP core obtained from Synthesis Example 1 in accordance with the same procedure as in Comparative Example 1, and then a mixed solution of tris(trimethylsilyl)phosphine (TMS3P) and trioctylphosphine and a solution in which indium acetate and palmitic acid are dissolved in 1-octadecene are injected thereto using a syringe pump at 300° C. Acetone is added into the reaction solution which is rapidly cooled at a room temperature and centrifuged to provide a precipitate, and the precipitate is dispersed in toluene again to provide InP/ZnSe/InP quantum dots (hereinafter, referred to as QD) in which a ZnSe shell is formed on the InP core, and a second light emitting core of a InP core is formed thereon again.

A thickness of the ZnSe shell in the obtained QD and a thickness of the second InP core are measured, and the results are shown in Table 1. In addition, the emission peak wavelength of the obtained QD is measured, and the results are also shown in Table 1.

Comparative Example 3: Preparation of InP/ZnSe/InP Quantum Dot

Quantum dot including InP/ZnSe/InP is produced as in Comparative Example 2, except that the second light emitting core is formed with two times of the amounts of the indium precursor and the phosphorous precursor, and the reaction time is also twice increased, so that the thickness of the second light emitting core of the obtained quantum dot is twice as thick as the thickness of the quantum dots according to Comparative Example 2.

The thickness of the ZnSe shell and the thickness of the second InP core in the obtained QD are measured, and the results are shown in Table 1. In addition, the emission peak wavelength of the obtained QD is measured, and the results are also shown in Table 1.

Reference Examples 1 and 2: Preparation of InP/ZnSe/ZnS/InP Quantum Dot

Quantum dot including InP/ZnSe/ZnS is produced in accordance with the same method as in Comparative Example 1, but the amounts of the zinc precursor, the selenium precursor, and the sulfur precursor are adjusted and the reaction time is prolonged to provide a quantum dot, so that the thicknesses of the ZnSe shell and the ZnS shell are 0.4 nm and 0.6 nm, respectively.

The obtained quantum dots are further formed with InP cores which are second light emitting cores having thicknesses of each 0.3 nm and 0.8 nm in accordance with the same method as in Comparative Examples 2 and 3, so as to provide InP/ZnSe/ZnS/InP quantum dots according to Reference Examples 1 and 2, respectively, including a first InP core, a ZnSe shell and a ZnS shell formed thereon, and further including a InP core of a second light emitting core formed thereon.

A size of the first InP cores, thicknesses of the ZnSe shells, thicknesses of the ZnS shells, and thicknesses of the second InP cores in the obtained QDs are measured, and the results are shown in Table 1. In addition, the emission peak wavelengths of the obtained QDs are measured, and the results are also shown in Table 1.

Example 1: Preparation of InP/ZnSe/ZnS/InP/ZnSe/ZnS Quantum Dot

An additional ZnSe and ZnS shell is formed on the quantum dot obtained from Reference Example 1 to provide a InP/ZnSe/ZnS/InP/ZnSe/ZnS quantum dot including a first InP core, a ZnSe shell and a ZnS shell disposed thereon, a second InP core disposed on the shell, and a second ZnSe shell and a ZnS shell disposed on the second InP core.

Specifically, 0.6 mmol of zinc acetate and 1.2 mmol of oleic acid are dissolved in 10 mL of trioctylamine in 200 mL reaction flask and vacuumed at 120° C. for 10 minutes. After substituting inside of the reaction flask with $N_2$, a toluene dispersion of the InP/ZnSe/ZnS/InP semiconductor nanocrystal synthesized from Reference Example 1 is rapidly added thereto while increasing a temperature of the obtained solution up to 320° C., and a predetermined amount of the prepared Se/TOP stock solution is added thereto and a reaction is performed for 30 minutes to provide an additional ZnSe layer on the InP core. Subsequently, the S/TOP stock solution is added together with the zinc acetate into the reaction solution at the reaction temperature and reacted for 30 minutes to provide a reaction solution including InP/ZnSe/ZnS/InP/ZnSe/ZnS quantum dots in which an additional ZnS layer is formed on the ZnSe layer.

An excess amount of ethanol is added to the reaction solution including InP/ZnSe/ZnS/InP/ZnSe/ZnS quantum dots and the resultant is centrifuged. After centrifuging the same, a supernatant is discarded, and a precipitate is dried and dispersed in chloroform or toluene to provide a InP/ZnSe/ZnS/InP/ZnSe/ZnS quantum dot solution (hereinafter, QD solution).

The amounts of the Se precursor and the S precursor used for forming the shell are 0.2 mol and 0.1 mol, respectively, and the amount of the used Zn precursor is 0.6 mol.

The size of the obtained QD, the size of the core in the QD, the thicknesses of the ZnSe shell and the ZnS shell in the first shell, the size of the second InP core, and the thicknesses of the ZnSe shell and the ZnS shell in the second shell are each measured, and the results are shown in Table 1. In addition, the emission peak wavelength of the obtained QD and OD per particle are measured, and the results are shown in Table 1.

Furthermore, the quantum dot is formed for a pattern of the quantum dot-polymer composite according to a method of Comparative Example 1, and then an emission peak wavelength and a blue light absorption rate are measured, and the results are also shown in Table 1.

Comparative Example 4: Preparation of InP/ZnSe/ZnS/InP/ZnSe/ZnS Quantum Dot

Quantum dot according to Comparative Example 4 is produced in accordance with the same procedure as in Example 1, except that the second ZnSe shell and ZnS shell having the same thickness are formed on the second light emitting core using the QD obtained from Reference Example 2 instead of the QD obtained from Reference Example 1.

The size of the core, the thicknesses of the ZnSe shell and the ZnS shell in the first shell, the size of the second InP core, and the thicknesses of the ZnSe shell and the ZnS shell in the second shell are each measured, and the results are shown in Table 1. Also, the emission peak wavelength of the obtained QD is measured, and the results are shown in Table 1.

TABLE 1

| | | Thickness (nm) | | | | | | | Synthesis result | | Single film result | |
| | | First light emitting core | First shell | | Second light emitting core | Second shell | | Diameter | Luminescence characteristics (Emission Peak Wavelength | OD/ | Blue Light Absorption | Emission Peak Wave- |
| | Structure | InP | ZnSe | ZnS | InP | ZnSe | ZnS | (nm) | (nm)) | particle | rate | length |
| Comp. Ex.1 | InP/ZnSe/ZnS | 2.08 | 1.8 | 0.3 | — | | | 6.28 | 532 | 2.72 E-17 | 79% | 538 nm |
| Comp. Ex.2 | InP/ZnSe/InP (thin) | 2.08 | 0.14 | — | 0.3 | | | | 580 | | | |
| Comp. Ex.3 | InP/ZnSe/InP (thick) | 2.08 | 0.14 | — | 0.6 | | | | 679 | | | |
| Ref. Ex.1 | InP/ZnSe/ZnS/InP (thin) | 2.08 | 0.4 | 0.6 | 0.3 | | | | 514 | | | |
| Ref. Ex.2 | InP/ZnSe/ZnS/InP (thick) | 2.08 | 0.4 | 0.6 | 0.8 | | | | 513 | | | |
| Ex.1 | InP/ZnSe/ZnS/ InP/ZnSe/ZnS | 2.08 | 0.4 | 0.6 | 0.3 | 0.4 | 0.6 | 6.68 | 521 | 1.65 E-16 | 86% | 534 nm |
| Comp. Ex.4 | InP/ZnSe/ZnS/ InP/ZnSe/ZnS | 2.08 | 0.4 | 0.6 | 0.8 | 0.4 | 0.6 | | 565 | | | |

Referring to Table 1, the quantum dot according to an embodiment including two emission cores of a core including a first semiconductor nanocrystal including indium and phosphorus and a light emitting layer surrounding the core and including a second semiconductor nanocrystal including indium and phosphorus; a first shell disposed between the core and the light emitting layer and including a semiconductor nanocrystal including zinc, and selenium, sulfur, or a combination thereof and a second shell disposed on the light emitting layer and including a semiconductor nanocrystal including zinc, and selenium, sulfur, or a combination thereof, does not include cadmium and has an emission peak wavelength in a range of about 500 nm to about 550 nm and has a highly improved light absorbance per particle at 450 nm of greater than 10 times the light absorbance per particle at 450 nm of the quantum dot according to Comparative Example 1 including the InP single emission core and including ZnSe and ZnS shells (1.65E-16 compared to 2.72E-17), while having an insignificant difference of light emission peak wavelength compared to the quantum dot according to Comparative Example 1. Thus, the blue light absorption rate of the quantum dots according to an embodiment has been significantly improved.

In addition, the pattern of the quantum dot-polymer composite including the quantum dot according to an embodiment exhibits an emission peak wavelength difference from the quantum dot according to Comparative Example 1 of only 4 nm, although the blue light absorption rate is increased. Accordingly, the quantum dot according to an embodiment shows, e.g., exhibits, improved luminescence properties by increasing the blue light absorption rate, and may be useful in various display devices and a biological labeling (e.g., bio sensor or bio imaging, etc.), a photo detector, a solar cell, a hybrid composite, and the like.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A quantum dot, comprising
    a core comprising a first semiconductor nanocrystal comprising indium and phosphorus,
    a light emitting layer surrounding the core, the light emitting layer comprising a second semiconductor nanocrystal comprising indium and phosphorus,
    a first shell disposed between the core and the light emitting layer, the first shell comprising a semiconductor nanocrystal comprising
        zinc, and
        selenium, and
    a second shell disposed on the light emitting layer, the second shell comprising a semiconductor nanocrystal comprising
        zinc, and
        selenium, sulfur, or a combination thereof,
    wherein the quantum dot does not comprise cadmium, and
    the quantum dot is a single light emitting quantum dot having an emission peak wavelength in a range of about 500 nanometers to about 550 nanometers.

2. The quantum dot of claim 1, wherein the core has a size of about 1.5 nanometers to about 3 nanometers.

3. The quantum dot of claim 1, wherein the light emitting layer has a thickness of less than or equal to about 0.5 nanometers.

4. The quantum dot of claim 1, wherein the first shell has a thickness of about 0.3 nanometers to about 1.2 nanometers.

5. The quantum dot of claim 1, wherein the second shell has a thickness of greater than or equal to about 0.3 nanometers.

6. The quantum dot of claim 1, wherein
    the first shell of the quantum dot is disposed directly on the core, and
    the first shell of the quantum dot comprises
        a first layer comprising a third semiconductor nanocrystal, and
        a second layer disposed on the first layer, the second layer comprising a fourth semiconductor nanocrystal,
        wherein the third semiconductor nanocrystal and the fourth semiconductor nanocrystal have different compositions.

7. The quantum dot of claim 6, wherein the first layer of the first shell has a thickness of about 0.1 nanometers to about 1.0 nanometers, and the second layer has a thickness of about 0.2 nanometers to about 1.1 nanometers.

8. The quantum dot of claim 1, wherein the second shell comprises
    a first layer disposed directly on the light emitting layer, the first layer comprising a fifth semiconductor nanocrystal, and
    a second layer disposed on the first layer, the second layer comprising a sixth semiconductor nanocrystal,
    wherein the fifth semiconductor nanocrystal and the sixth semiconductor nanocrystal have different compositions.

9. The quantum dot of claim 8, wherein the fifth semiconductor nanocrystal comprises zinc and selenium, and the sixth semiconductor nanocrystal comprises zinc and sulfur.

10. The quantum dot of claim 9, wherein the sixth semiconductor nanocrystal does not comprise selenium.

11. The quantum dot of claim 1, wherein the first semiconductor nanocrystal further comprises zinc.

12. The quantum dot of claim 1, wherein the quantum dot has a first absorption peak in the ultraviolet-visible absorption spectrum between about 390 nanometers and about 500 nanometers.

13. The quantum dot of claim 1, wherein the light absorbance per particle of the quantum dot is greater than or equal to about 1.0E-17.

14. The quantum dot of claim 1, wherein the quantum dot comprises RCOOH, RCOOCOR, $RNH_2$, $R_2NH$, $R_3N$, RSH, $R_3PO$, $R_3P$, ROH, RCOOR', $RPO(OH)_2$, $R_2POOH$, wherein, R and R' are independently a substituted or unsubstituted C1 to C30 aliphatic hydrocarbon group, a substituted or unsubstituted C6 to C30 substituted or unsubstituted aromatic hydrocarbon group, or a combination thereof, or a combination thereof, on a surface thereof.

15. A quantum dot, comprising
    a core comprising a first semiconductor nanocrystal comprising indium and phosphorus,
    a light emitting layer surrounding the core, the light emitting layer comprising a second semiconductor nanocrystal comprising indium and phosphorus,
    a first shell disposed between the core and the light emitting layer, the first shell being disposed directly on the core, the first shell of the quantum dot comprising a first layer comprising a third semiconductor nanocrystal, the third semiconductor nanocrystal comprising zinc, and selenium, and a second layer disposed on the first layer, the second layer comprising a fourth semiconductor nanocrystal, the fourth semiconductor nanocrystal comprising zinc, and sulfur, and a second shell disposed on the light emitting layer, the second shell comprising a semiconductor nanocrystal comprising zinc, and selenium, sulfur, or a combination thereof, wherein the quantum dot does not comprise cadmium, and wherein the quantum dot is a single light emitting quantum dot having an emission peak wavelength in a range of about 500 nanometers to about 550 nanometers, and wherein the third semiconductor nanocrystal and the fourth semiconductor nanocrystal have different compositions.

16. The quantum dot of claim 15, wherein the fourth semiconductor nanocrystal does not comprise selenium.

17. A quantum dot-polymer composite comprising a polymer matrix; and quantum dots of claim 1 dispersed in the polymer matrix.

18. The quantum dot-polymer composite of claim 17, wherein the polymer matrix comprises a thiolene resin, a (meth)acrylate polymer, a urethane resin, an epoxy polymer, vinyl polymer, a silicone resin, or a combination thereof.

19. A display device comprising a light source and a luminescent element, wherein the luminescent element comprises the quantum dot-polymer composite of claim 17, the light source is configured to provide the luminescent element, with incident light.

20. An electroluminescent device, comprising a first electrode and a second electrode facing each other; and a quantum dot emission layer disposed between the first electrode and the second electrode, the quantum dot emission layer comprising a plurality of quantum dots, wherein each of the plurality of quantum dots comprises:

a core comprising a first semiconductor nanocrystal comprising indium and phosphorus, a light emitting layer surrounding the core, the light emitting layer comprising a second semiconductor nanocrystal comprising indium and phosphorus, a first shell disposed between the core and the light emitting layer, the first shell comprising a semiconductor nanocrystal comprising zinc, and selenium, sulfur, or a combination thereof, and a second shell disposed on the light emitting layer, the second shell comprising a semiconductor nanocrystal comprising zinc, and selenium, sulfur, or a combination thereof, wherein the plurality of quantum dots do not comprise cadmium, and wherein the plurality of quantum dots are single light emitting quantum dots having an emission peak wavelength in a range of about 500 nanometers to about 550 nanometers.

* * * * *